United States Patent
He et al.

(10) Patent No.: US 12,048,236 B2
(45) Date of Patent: Jul. 23, 2024

(54) UV PATTERNABLE POLYMER BLENDS FOR ORGANIC THIN-FILM TRANSISTORS

(71) Applicant: Corning Incorporated, Corning, NY (US)

(72) Inventors: Mingqian He, Horseheads, NY (US); Jenny Kim, Horseheads, NY (US); Xin Li, Shanghai (CN); Yang Li, Shanghai (CN); Hongxiang Wang, Shanghai (CN)

(73) Assignee: CORNING INCORPORATED, Corning, NY (US)

( * ) Notice: Subject to any disclaimer, the term of this patent is extended or adjusted under 35 U.S.C. 154(b) by 654 days.

(21) Appl. No.: 17/283,359

(22) PCT Filed: Oct. 7, 2019

(86) PCT No.: PCT/US2019/054916
§ 371 (c)(1),
(2) Date: Apr. 7, 2021

(87) PCT Pub. No.: WO2020/076662
PCT Pub. Date: Apr. 16, 2020

(65) Prior Publication Data
US 2021/0384433 A1    Dec. 9, 2021

(30) Foreign Application Priority Data

Oct. 12, 2018  (CN) .......................... 201811190154.6

(51) Int. Cl.
*H01L 51/00*   (2006.01)
*C08L 53/02*   (2006.01)
(Continued)

(52) U.S. Cl.
CPC ............ *H10K 85/113* (2023.02); *C08L 53/02* (2013.01); *G03F 7/038* (2013.01); *H10K 85/111* (2023.02);
(Continued)

(58) Field of Classification Search
CPC .......... G03F 7/038; G03F 7/2002; G03F 7/30
See application file for complete search history.

(56) References Cited

U.S. PATENT DOCUMENTS 8,703,391 B1   4/2014  Dirk et al.
9,425,417 B2   8/2016  Wierzchowiec et al.
(Continued)

FOREIGN PATENT DOCUMENTS

CN    101085916 A    12/2007
CN    102010499 A    4/2011
(Continued)

OTHER PUBLICATIONS

International Search Report and Written Opinion of the International Searching Authority; PCT/US2019/054916; Mailed on Feb. 12, 2020, 11 pages; European Patent Office.
(Continued)

*Primary Examiner* — Walter H Swanson
(74) *Attorney, Agent, or Firm* — Travis B. Gasa

(57) ABSTRACT

A polymer blend includes an organic semiconductor polymer blended with an isolating polymer; at least one photoinitiator for generating active radicals; and at least one crosslinker comprising C=C bonds, thiols, or combinations thereof, such that the organic semiconductor polymer is a diketopyrrolopyrrole-fused thiophene polymeric material, the fused thiophene is beta-substituted, and the isolating polymer has a non-conjugated backbone. A method of forming an organic semiconductor device having the polymer blend is also presented.

20 Claims, 7 Drawing Sheets

(51) Int. Cl.
  *G03F 7/038* (2006.01)
  *H10K 85/10* (2023.01)
  *G03F 7/20* (2006.01)
  *G03F 7/30* (2006.01)
  *H10K 10/46* (2023.01)
  *H10K 71/15* (2023.01)

(52) U.S. Cl.
  CPC .............. *G03F 7/2002* (2013.01); *G03F 7/30* (2013.01); *H10K 10/466* (2023.02); *H10K 71/15* (2023.02)

(56) References Cited

U.S. PATENT DOCUMENTS

| | | | |
|---|---|---|---|
| 2006/0251886 A1 | 11/2006 | Mueller et al. | |
| 2009/0184635 A1 | 7/2009 | Pan et al. | |
| 2010/0183820 A1* | 7/2010 | Seubert | B05D 3/0209 427/493 |
| 2011/0139253 A1 | 6/2011 | Wachi et al. | |
| 2013/0109821 A1 | 5/2013 | He et al. | |
| 2014/0306212 A1* | 10/2014 | Kaihovirta | C08K 5/132 438/46 |
| 2015/0243915 A1* | 8/2015 | Wigglesworth | H10K 10/476 257/40 |
| 2016/0155633 A1* | 6/2016 | Zhou | C08J 3/24 257/632 |
| 2017/0148991 A1* | 5/2017 | Duggeli | H10K 85/111 |

FOREIGN PATENT DOCUMENTS

| | | | | |
|---|---|---|---|---|
| CN | 102201535 | A | 9/2011 | |
| CN | 108250414 | A | 7/2018 | |
| EP | 1410448 | A1 | 4/2004 | |
| JP | 5355857 | B2 | 11/2013 | |
| JP | 2016-128559 | A | 7/2016 | |
| TW | 201522545 | A | 6/2015 | |
| WO | 02/21611 | A1 | 3/2002 | |
| WO | 2014/035716 | A1 | 3/2014 | |
| WO | 2017/001823 | A1 | 1/2017 | |
| WO | WO-2018149750 | A1 * | 8/2018 | .......... C04B 24/161 |

OTHER PUBLICATIONS

Lei et al; "Enhancing Crystalline Structural Orders of Polymer Semiconductors for Efficient Charge Transport via Polymer-Matrix-Mediated Molecular Self-Assembly"; Adv. Mater.; 2016, 28; pp. 6687-6694.
Shi, Q., et al., "High performance tetrathienoacene-DDP based polymer thin-film transistors using a photo-patternable epoxy gate insulating layer," Organic Electronics 2014, 15, 991-996.
Taiwanese Patent Application No. 108136220, Office Action, dated Apr. 14, 2023, 1 page; Taiwanese Patent Office.
Arias et al., "Surface-Induced Self-Encapsulation of Polymer Thin-Film Transistors", Adv. Mater., 2006, vol. 18, pp. 2900-2904.
Babel et al., "Morphology and Field-Effect Mobility of Charge Carriers in Binary Blends of Poly(3-hexylthiophene) with Poly[2-methoxy-5-(2-ethylhexoxy)-1,4-phenylenevinylene] and Polystyrene", Macromolecules 2004, 37, 26, pp. 9835-9840.
Baude et al., "Pentacene-based radio-frequency identification circuitry", Applied Physics Letters, 82(22), 2008 pp. 3964-3966.
C. Decker et al., "High-Speed Photocrosslinking of Thermoplastic Styrene-Butadiene Elastomers", Journal of Applied Polymer Science, vol. 77, Issue 9, Aug. 2000, pp. 1902-1912.
C. Decker et al., "Photocrosslinking of functionalized rubbers, 8. The thiol-polybutadiene system", Macromolecular Chemistry Physics, vol. 200, Issue8, Aug. 1999, pp. 1965-1974.
Charas et al., "Observation of field-effect in a cross-linked polyfluorene semiconductor", Chemical Physics. Letters, 2008, vol. 455, Issue 4-6, pp. 189-191.
Crone et al., "Large-scale complementary integrated circuits based on organic transistors", letters to nature, 2000, vol. 403, pp. 521-523.
DeFranco et al., "Photolithographic patterning of organic electronic materials", Organic Electronics 7, 2006, pp. 22-28.
Fukuda et al., "Printed organic transistors with uniform electrical performance and their application to amplifiers in biosensors", Advanced Electronic Materials, vol. 1, Issue 7, 2015, 1400052.
Gelinck et al., "Flexible active-matrix displays and shift registers based on solution-processed organic transistors" Nature Materials, 2004, vol. 3 No. 2, pp. 106-110.
H. N. Tsao, Ultrahigh Mobility in Polymer Field-Effect Transistors by Design J. American Chemical Socity, 2011, vol. 133, No. 8, pp. 2605-2612.
H. Yan et al., "A high-mobility electron-transporting polymer for printed transistors", Nature, 2009, 457, pp. 679-686.
Jacobine, "Thiol-Ene Photopolymers", Radiation Curing in Polymer Science and Technology, Elsevier: London, Chapter 7, 1993, pp. 219-268.
Jang et al., "Fully inkjet-printed transparent oxide thin film transistors using a fugitive wettability switch", Advanced Electronic Materials, vol. 1, Issue 7, 2015, 1500086.
Khire et al, "Formation and Surface Modification of Nanopatterned Thiol-ene Substrates using Step and Flash Imprint Lithography", Advance Materials, vol. 20, Issue17, 2008 pp. 3308-3313.
Kun Iu et al., "Novel Functionalized Conjugated Polythiophene with Oxetane Substituents: Synthesis, Optical, Electrochemical, and Field-Effect Properties", Macromolecules 2009, 42, 9, pp. 3222-3226.
L. L. Chua et al., Observation of Field-Effect Transistor Behavior at Self-Organized Interfaces, Adv. Mater., 2004, vol. 16, Issue 18, pp. 1609-1615.
L. Z. Qiu et al., "Organic Thin-Film Transistors Based on Blends of Poly(3-hexylthiophene) and Polystyrene with a Solubility-Induced Low Percolation Threshold", Chem. Mater., 2009, 21, pp. 4380-4386.
L. Z. Qiu et al., Organic Thin-film Transistors Based on Polythiophene Nanowires Embedded in Insulating Polymer Adv. Mater., 2009, vol. 21, Issue13, pp. 1349-1353.
L. Z. Qiu et al., Versatile Use of Vertical-Phase-Separation-Induced Bilayer Structures in Organic Thin-Film Transistors, Adv. Mater., 2008, vol. 20, Issue 6, pp. 1141-1145.
S. Goffri et al., "Multicomponent semiconducting polymer systems with low crystallization-induced percolation threshold", Nat. Mater., 2006, 5, pp. 950-956.
S. Ogawa et al., "Photoinduced doping effect of pentacene field effect transistor in oxygen atmosphere studied by displacement current measurement", Appl. Phys. Lett., 2005, 86, 252104.
Sekitani et al., "A Rubberlike Stretchable Active Matrix Using Elastic Conductors", Science, 2008, vol. 321, Issue 5895, pp. 1468-1472.
Zhu et al., "Humidity sensors based on pentacene thin-film transistors", Applied Physics Letters, 2002, vol. 81(24), pp. 4643-4645.

* cited by examiner

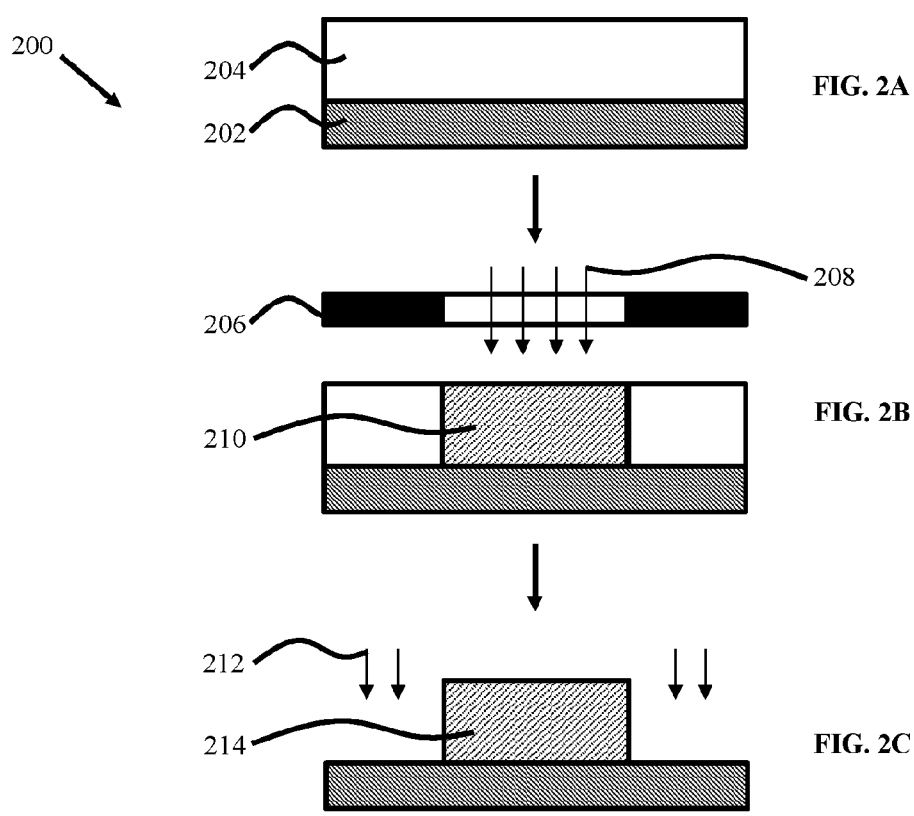

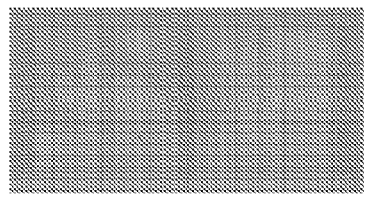
FIG. 4A
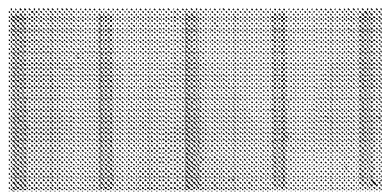 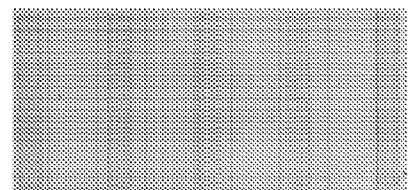
FIG. 4B          FIG. 4C
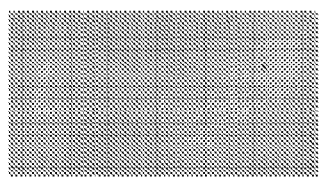 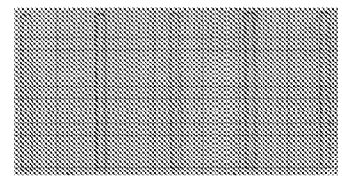
FIG. 4D          FIG. 4E
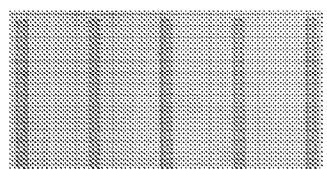 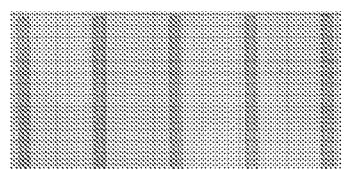
FIG. 4F          FIG. 4G

UV PATTERNABLE POLYMER BLENDS FOR ORGANIC THIN-FILM TRANSISTORS

CROSS-REFERENCE TO RELATED APPLICATIONS

This application is a national stage application under 35 U.S.C. § 371 of International Application No. PCT/US2019/054916, filed on Oct. 7, 2019, which claims the benefit of priority under 35 U.S.C. § 119 of Chinese Patent Application Serial No. 201811190154.6, filed on Oct. 12, 2018, the contents of both of which are relied upon and incorporated herein by reference in their entirety.

BACKGROUND

1. Field

The disclosure relates to UV patternable organic semiconductor/isolating polymer blends as semiconducting layers for organic thin-film transistors (OTFTs).

2. Technical Background

Organic thin-film transistors (OTFTs) have garnered extensive attention as alternatives to conventional silicon-based technologies, which require high temperature and high vacuum deposition processes, as well as complex photolithographic patterning methods. Semiconducting (i.e., organic semiconductor, OSC) layers are one important component of OTFTs which can effectively influence the performance of devices.

Traditional technologies in the manufacture of inorganic TFT device arrays often rely on photolithography as the patterning process. However, photolithography usually involves harsh oxygen ($O_2$) plasma during pattern transfer or photoresist removal and aggressive developing solvents which may severely damage the OSC layer and lead to significant deterioration of device performance.

This disclosure presents improved UV patternable organic semiconductor/isolating polymer blends and use thereof for OSC layers of organic thin-film transistors.

SUMMARY

In some embodiments, a polymer blend, comprises: an organic semiconductor polymer blended with an isolating polymer; at least one photoinitiator configured to generate active radicals; and at least one crosslinker comprising C=C bonds, thiols, or combinations thereof, wherein the organic semiconductor polymer is a diketopyrrolopyrrole-fused thiophene polymeric material, wherein the fused thiophene is beta-substituted, and wherein the isolating polymer has a non-conjugated backbone.

In one aspect, which is combinable with any of the other aspects or embodiments, the organic semiconductor polymer is present in a range of 1 wt. % to 99 wt. %; the isolating polymer is present in a range of 1 wt. % to 99 wt. %; the at least one photoinitiator is present in a range of 0.1 wt. % to 5 wt. %; and the at least one crosslinker is present in a range of 0.05 wt. % to 10 wt. %.

In one aspect, which is combinable with any of the other aspects or embodiments, the organic semiconductor polymer is present in a range of 10 wt. % to 50 wt. %.

In one aspect, which is combinable with any of the other aspects or embodiments, the at least one photoinitiator is present in a range of 0.1 wt. % to 2.0 wt. %; and the at least one crosslinker is present in a range of 0.3 wt. % to 5.0 wt. %.

In one aspect, which is combinable with any of the other aspects or embodiments, the polymer blend further comprises: at least one of antioxidants, lubricants, compatibilizers, or leveling agents present in a range of 0.05 wt. % to 5 wt. %.

In one aspect, which is combinable with any of the other aspects or embodiments, the organic semiconductor polymer comprises the repeat unit of Formula 1 or Formula 2, or a salt, isomer, or analog thereof:

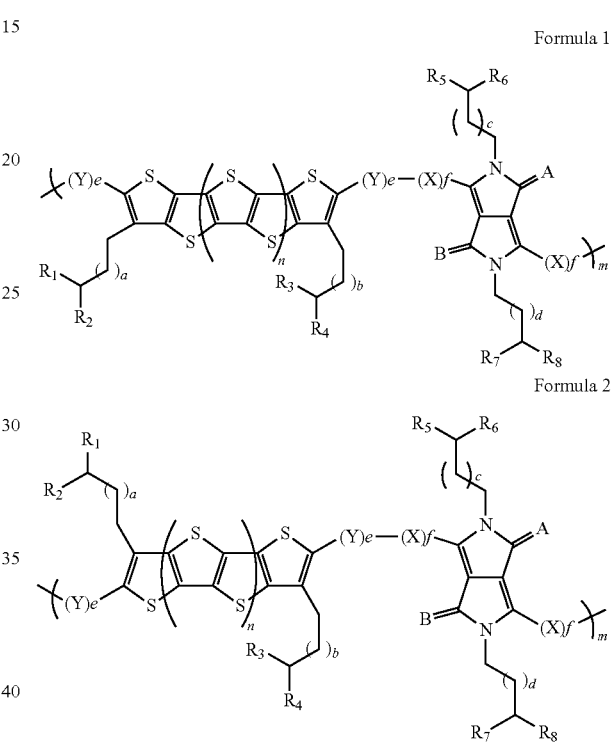

Formula 1

Formula 2 wherein in Formula 1 and Formula 2: m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) e and f cannot both be 0; (v) if either e or f is 0, then c and d, independently, are integers greater than or equal to 5; and (vi) the polymer having a molecular weight, wherein the molecular weight of the polymer is greater than 10,000.

In one aspect, which is combinable with any of the other aspects or embodiments, the isolating polymer is at least one of polyacrylonitrile (PAN), polyvinyl chloride (PVC), polyvinylidene fluoride (PVDF), alkyl-substituted polyacrylonitrile (R-PAN), polyethylene (PE), polystyrene, styrene-butadiene-styrene (SBS), styrene-isoprene-styrene (SIS), styrene-butadiene-styrene rubber (SBR), polystyrene-co-acrylonitrile, acrylonitrile-butadiene-styrene (ABS), styrene-ethylene-butylene-styrene (SEBS), polydimethylsiloxane (PDMS), polysulfonate, polyvinylacetate, polycarbonate, polypropylene, poly(methyl methacrylate) (PMMA), polyamide, polyphenylene sulfide, polymethylmethacylate-block-polybutylacrylate (PMMA-b-PBA), or derivatives thereof, copolymers thereof and mixtures thereof.

In one aspect, which is combinable with any of the other aspects or embodiments, the isolating polymer comprises an unsaturated C=C backbone.

In one aspect, which is combinable with any of the other aspects or embodiments, the at least one photoinitiator comprises: 1-hydroxy-cyclohexyl-phenyl-ketone (184); 2-benzyl-2-dimethylamino-1-(4-morpholinophenyl)-butanone-1 (369); diphenyl(2,4,6-trimethylbenzoyl)phosphine oxide (TPO); 2-isopropyl thioxanthone (ITX); 1-[4-(phenylthio) phenyl]-1,2-octanedione 2-(O-benzyloxime) (HR-CURE-OXE01); 2,2-dimethoxy-1,2-diphenylethan-1-one (BDK); benzoyl peroxide (BPO); hydroxyacetophenone (HAP); 2-hydroxy-2-methylprophenone (1173); 2-methyl-4'-(methylthio)-2-morpholinopropiophenone (907); 2-Benzyl-2-(dimethylamino)-4'-morpholinobutyrophenone (IHT-PI 910); Ethyl-4-(dimethylamino)benzoate (EDB); Methyl O-Benzoyl Benzoate (OMBB); bis-(2,6 dimethoxy-benzoyl)-phenyl phosphine oxide (BAPO); 4-benzoyl-4' methyldiphenylsulfide (BMS); benzophenone (BP); 1-chloro-4-propoxy thiozanthone (CPTX); chlorothioxanthone (CTX); 2,2-diethoxyacetophenone (DEAP); diethyl thioxanthone (DETX); 2-dimethyl aminoethyl benzonate (DMB); 2,2-dimethoxy-2-phenyl acetophenone (DMPA); 2-ethyl anthraquinone (2-EA); ethyl-para-N,N-dimethyl-dimethylamino lenzoate (EDAB); 2-ethyl hexyl-dimethylaminolenzoate (EHA); 4,4-bis-(diethylamino)-benzophenone (EMK); methyl benzophenone (MBF); 4-methyl benzophenone (MBP); Michler's ketone (MK); 2-methyl-1-[4(methylthiol) phenyl]-2-morpholino propanone (1) (MMMP); 4-phenylbenzophenone (PBZ); 2,4,6-trimethyl-benzoly-ethoxyl phenyl phosphine oxide (TEPO); or combinations thereof.

In one aspect, which is combinable with any of the other aspects or embodiments, the at least one crosslinker comprises: triallyl isocyanurate (TAIC), trimethylolpropane mercaptopropionate (TRIS),

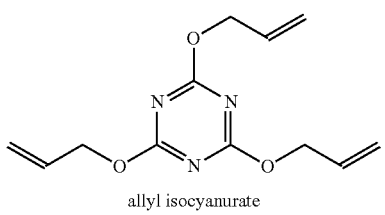

allyl isocyanurate

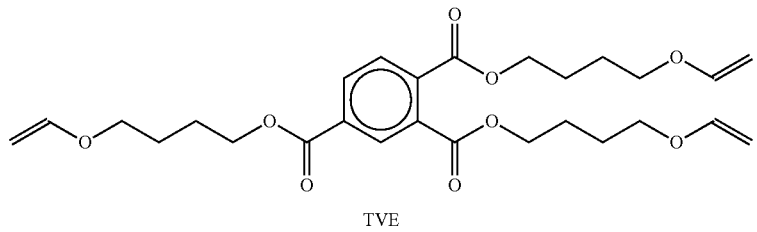

TVE

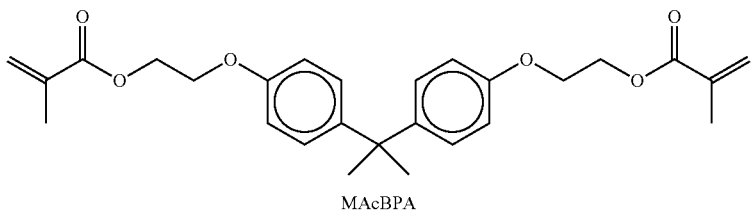

MAcBPA

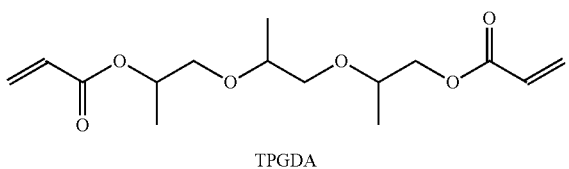

TPGDA

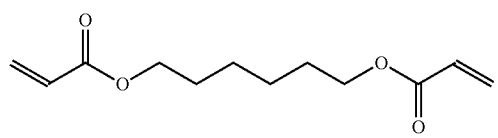

HDDA

-continued
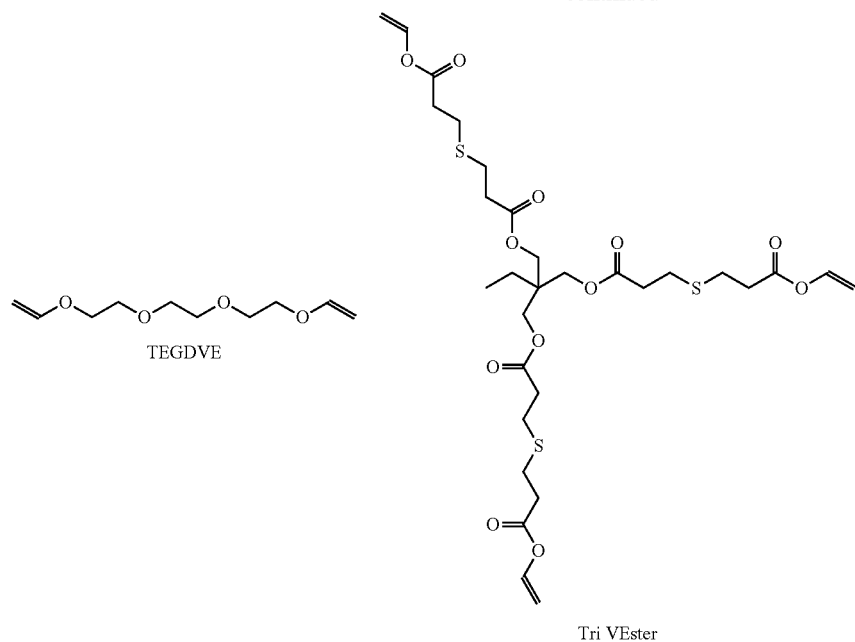
TEGDVE
Tri VEster
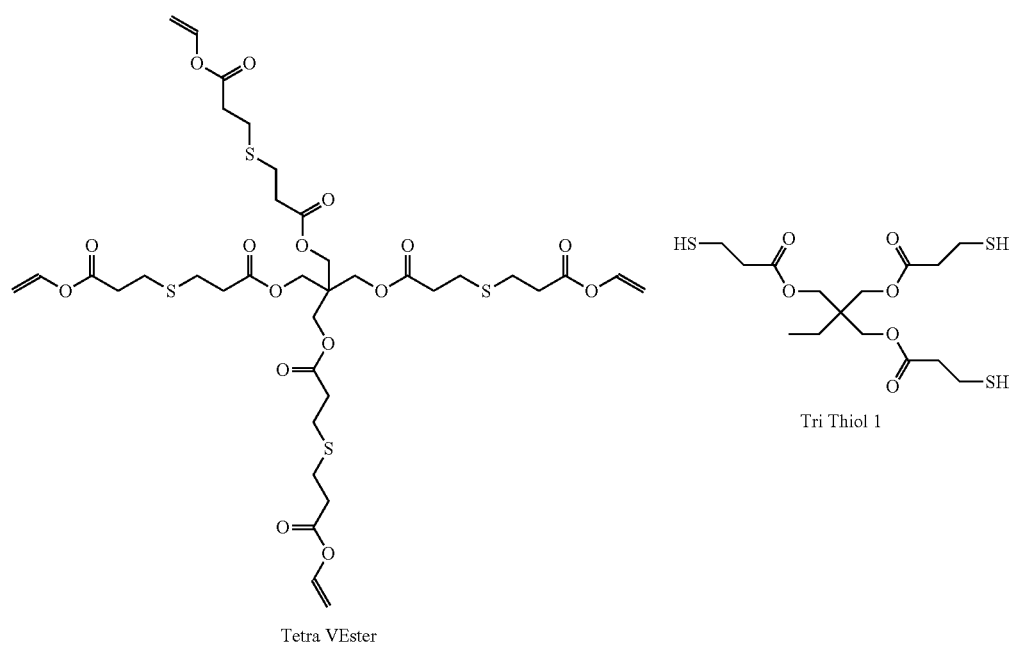
Tetra VEster
Tri Thiol 1
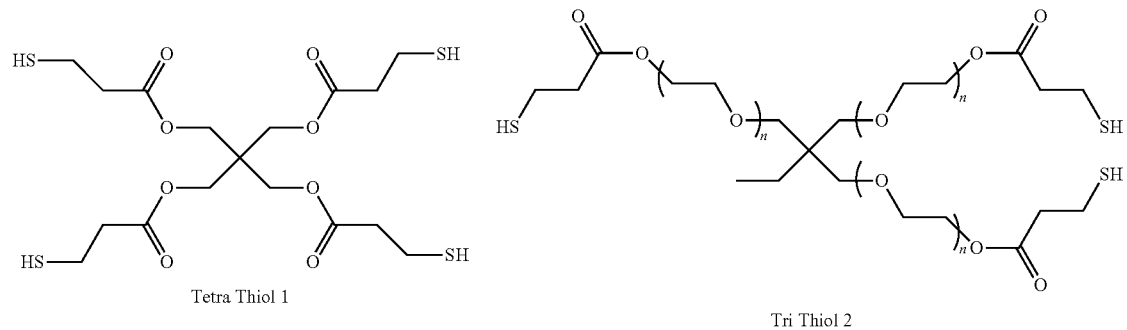
Tetra Thiol 1
Tri Thiol 2

-continued
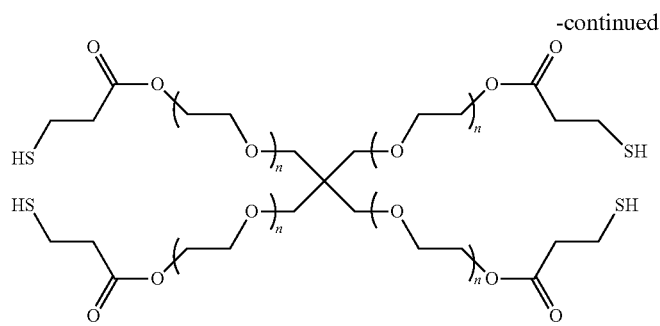
Tetra Thiol 2
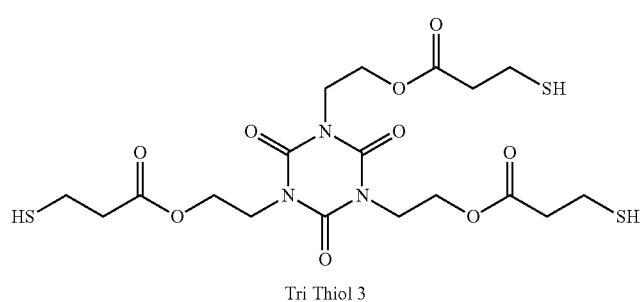
Tri Thiol 3
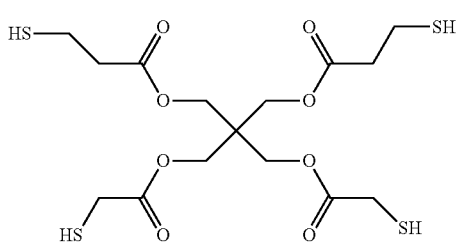
Tetra Thiol 3
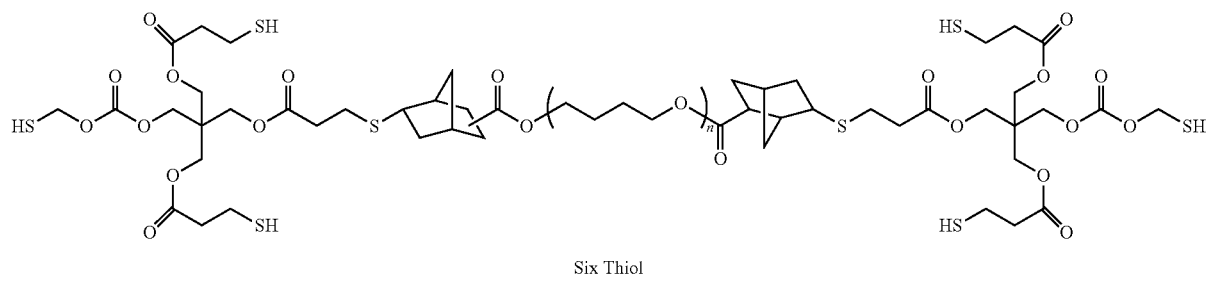
Six Thiol
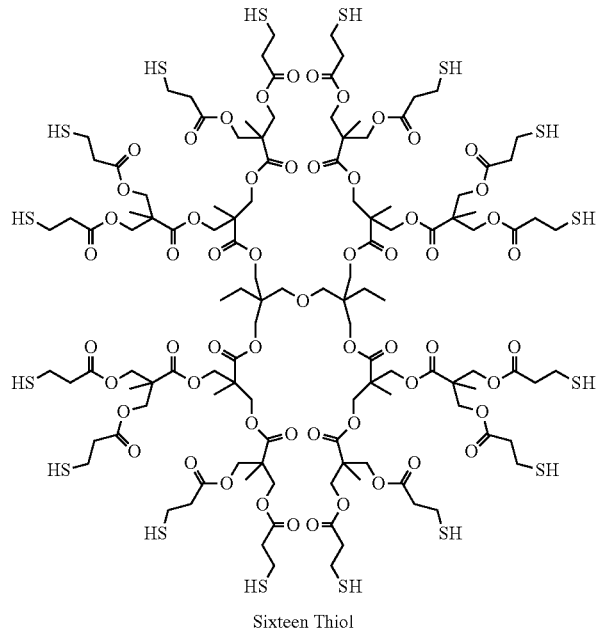
Sixteen Thiol -continued
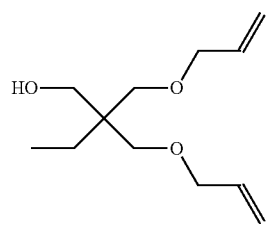
AE1
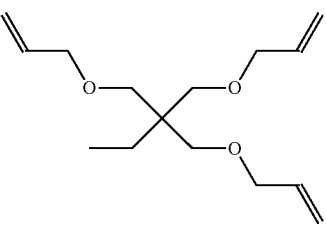
AE2
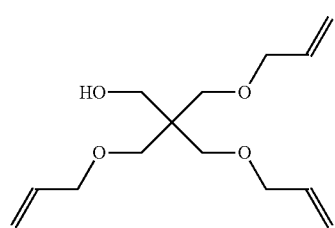
AE3
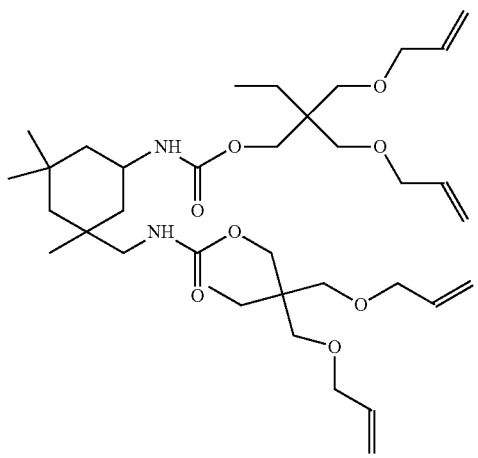
AE4
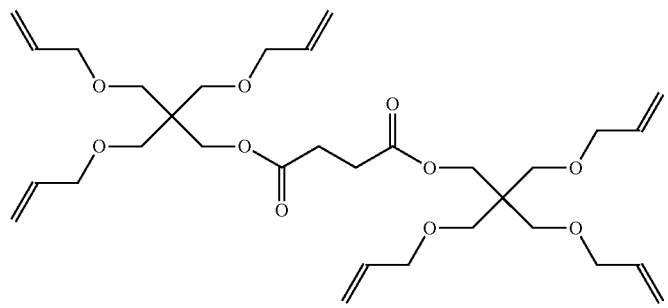
AE5
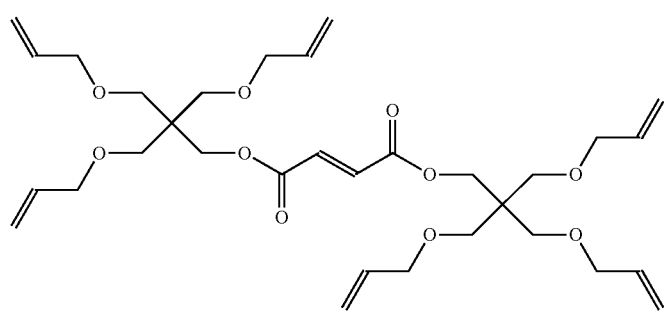
AE6

-continued

AE7

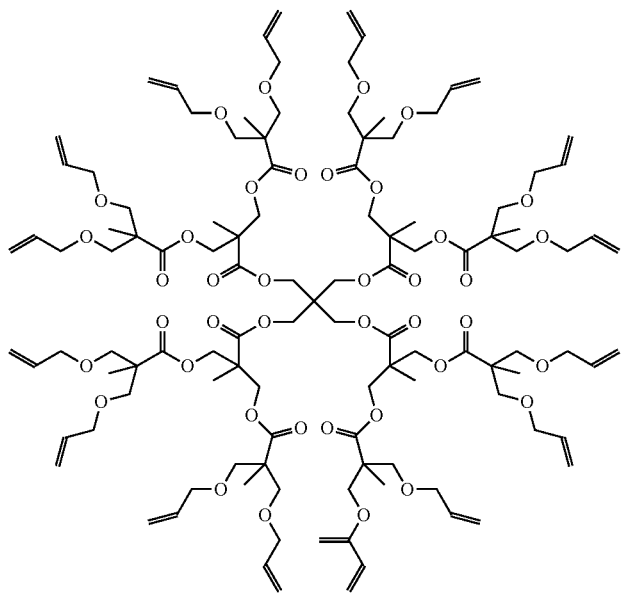

In some embodiments, a method of forming an organic semiconductor device comprises: blending an organic semiconductor polymer with an isolating polymer in an organic solvent to create a polymer blend; depositing a thin film of the polymer blend over a substrate; exposing the thin film to UV light using a photo-mask to form a patterned thin film; and developing the patterned thin film in a solvent to remove an un-patterned region of the thin film, wherein the organic semiconductor polymer is a diketopyrrolopyrrole-fused thiophene polymeric material, wherein the fused thiophene is beta-substituted, and wherein the isolating polymer has a non-conjugated backbone.

In one aspect, which is combinable with any of the other aspects or embodiments, the method further comprises: a first heating of the thin film at a temperature in a range of 50° C. to 200° C. for a time in a range of 10 sec to 10 min between the depositing and exposing.

In one aspect, which is combinable with any of the other aspects or embodiments, the method further comprises: a second heating of the patterned thin film at a temperature in a range of 50° C. to 200° C. for a time in a range of 10 sec to 30 min after the developing.

In one aspect, which is combinable with any of the other aspects or embodiments, the blending comprises: dissolving the organic semiconductor polymer in a first organic solvent to form a first solution; dissolving the isolating polymer in a second organic solvent to form a second solution; combining the first solution and the second solution to create a polymer blend.

In one aspect, which is combinable with any of the other aspects or embodiments, the polymer blend further comprises: at least one photoinitiator configured to generate active radicals; and at least one crosslinker comprising C=C bonds, thiols, or combinations thereof.

In one aspect, which is combinable with any of the other aspects or embodiments, the organic semiconductor polymer is present in a range of 1 wt. % to 99 wt. %; the isolating polymer is present in a range of 1 wt. % to 99 wt. %; the at least one photoinitiator is present in a range of 0.1 wt. % to 5 wt. %; and the at least one crosslinker is present in a range of 0.05 wt. % to 10 wt. %.

In one aspect, which is combinable with any of the other aspects or embodiments, the depositing comprises at least one of: spin coating; dip coating; spray coating; electrodeposition; meniscus coating; plasma deposition; and roller, curtain and extrusion coating.

In one aspect, which is combinable with any of the other aspects or embodiments, the exposing comprises: exposing the thin film to UV light having an energy in a range of 10 mJ/cm$^2$ to 600 mJ/cm$^2$ for a time in a range of 1 sec to 60 sec.

In one aspect, which is combinable with any of the other aspects or embodiments, the developing comprises exposing the un-patterned region of the thin film to a solvent comprising: chlorobenzene, 1,2-dichlorobenzene, 1,3-dichlorobenzene, 1,2,4-trichlorobenzene, dioxane, p-xylene, m-xylene, toluene, cyclopentanone, cyclohexanone, methyl lactate, 2-butanone, 2-pentanone, 3-pentanone, 2-heptanone, 3-heptanone, anisole, mesitylene, decalin, butylbenzene, cyclooctane, tetralin, chloroform, or combinations thereof, for a time in a range of 10 sec to 10 min.

In one aspect, which is combinable with any of the other aspects or embodiments, the method further comprises: forming a gate electrode over the substrate; forming a gate dielectric layer over the substrate; forming a patterned source and drain layer over the gate dielectric layer; and forming an insulator layer over the patterned source and drain layer.

In one aspect, which is combinable with any of the other aspects or embodiments, the isolating polymer comprises an unsaturated C=C backbone or is configured to generate C=C backbone prior to or during the UV light exposure.

BRIEF DESCRIPTION OF THE DRAWINGS

The disclosure will become more fully understood from the following detailed description, taken in conjunction with the accompanying figures, in which:

FIGS. 2A to 2C illustrate patterning techniques of organic semiconductor blends, according to some embodiments.

FIGS. 4A to 4G illustrate patterning of organic semiconductor blends with varying ratios of photoinitiators, according to some embodiments.

DETAILED DESCRIPTION

Figure 1A:
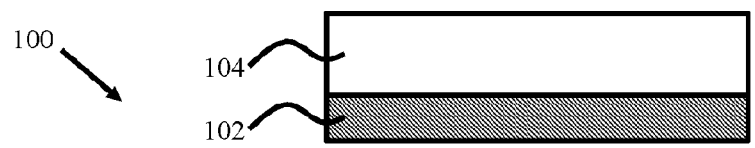
FIGS. 1A to 1E illustrate traditional patterning techniques of organic semiconductor blends utilizing photoresists.
Figure 1B:

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments. It should be understood that the present application is not limited to the details or methodology set forth in the description or illustrated in the figures. It should also be understood that the terminology is for the purpose of description only and should not be regarded as limiting.

Additionally, any examples set forth in this specification are illustrative, but not limiting, and merely set forth some of the many possible embodiments of the claimed invention. Other suitable modifications and adaptations of the variety of conditions and parameters normally encountered in the field, and which would be apparent to those skilled in the art, are within the spirit and scope of the disclosure.

Organic semiconductors as functional materials may be used in a variety of applications including, for example, printed electronics, organic transistors, including organic thin-film transistors (OTFTs) and organic field-effect transistors (OFETs), organic light-emitting diodes (OLEDs), organic integrated circuits, organic solar cells, and disposable sensors. Organic transistors may be used in many applications, including smart cards, security tags, and the backplanes of flat panel displays. Organic semiconductors may substantially reduce cost compared to inorganic counterparts, such as silicon. Depositing OSCs from solution may enable fast, large-area fabrication routes such as various printing methods and roll-to-roll processes.

Organic thin-film transistors are particularly interesting because their fabrication processes are less complex as compared with conventional silicon-based technologies. For example, OTFTs generally rely on low temperature deposition and solution processing, which, when used with semiconducting conjugated polymers, can achieve valuable technological attributes, such as compatibility with simple-write printing techniques, general low-cost manufacturing approaches, and flexible plastic substrates. Other potential applications for OTFTs include flexible electronic papers, sensors, memory devices (e.g., radio frequency identification cards (RFIDs)), remote controllable smart tags for supply chain management, large-area flexible displays, and smart cards.

Organic Semiconductor (OSC) Polymer

An OSC polymer may be used to produce organic semiconductor devices. In some examples, a polymer blend comprises an organic semiconductor polymer. In some examples, the OSC polymer has a main backbone that is fully conjugated. In some examples, the OSC is a diketopyrrolopyrrole (DPP) fused thiophene polymeric material. In some examples, the fused thiophene is beta-substituted. This OSC may contain both fused thiophene and diketopyrrolopyrrole units. In some examples, the OSC is used in OTFT applications. For example, the OSC polymer may comprise the repeat unit of Formula 1 or Formula 2, or a salt, isomer, or analog thereof:

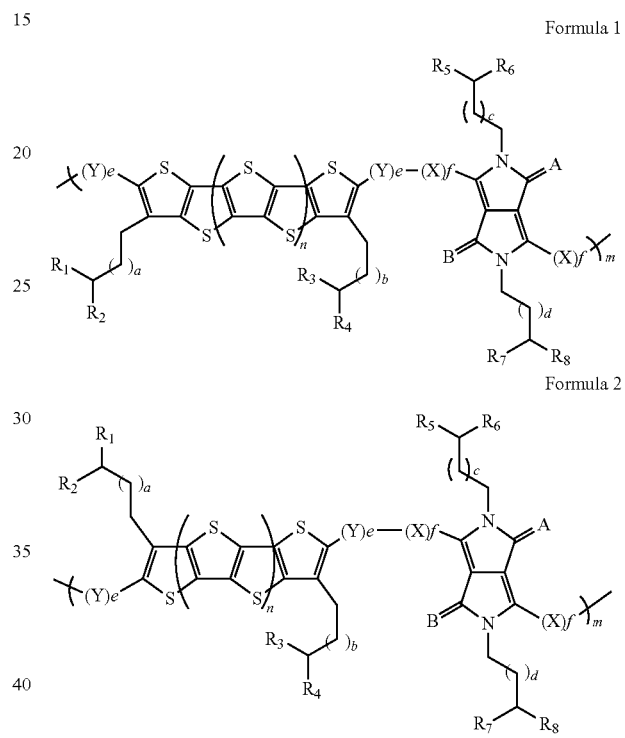

Formula 1

Formula 2 wherein in Formula 1 and Formula 2: m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that: (i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl; (ii) if any of $R_1$, $R_2$, $R_3$, or $R_4$ is hydrogen, then none of $R_5$, $R_6$, $R_7$, or $R_8$ are hydrogen; (iii) if any of $R_5$, $R_6$, $R_7$, or $R_8$ is hydrogen, then none of $R_1$, $R_2$, $R_3$, or $R_4$ are hydrogen; (iv) e and f cannot both be 0; (v) if either e or f is 0, then c and d, independently, are integers greater than or equal to 5; and (iv) the polymer having a molecular weight, wherein the molecular weight of the polymer is greater than 10,000.

In some embodiments, the OSC polymers defined in Formula 1 or Formula 2 enable simple transistor fabrication at relatively low temperatures, which is particularly important for the realization of large-area, mechanically flexible electronics. A beta-substituted OSC polymer can also help to improve solubility.

In some examples, the OSC polymer may comprise the repeat unit of Formula 3 or Formula 4, or a salt, isomer, or analog thereof:

of those endpoints. The hole mobilities may be equal to or greater than any of these values. In some examples, the OSC has hole mobilities of 1 to 4 $cm^2V^{-1}$ $s^{-1}$. In some examples, the OSC has hole mobilities of 2 $cm^2V^{-1}$ $s^{-1}$. In some examples, the OSC has hole mobilities of 2 $cm^2V^{-1}$ $s^{-1}$ or more.

In some examples, the OSC polymers have On/Off ratios of greater than $10^5$. In some examples, the OSC polymers have On/Off ratios of greater than $10^6$.

Formula 3

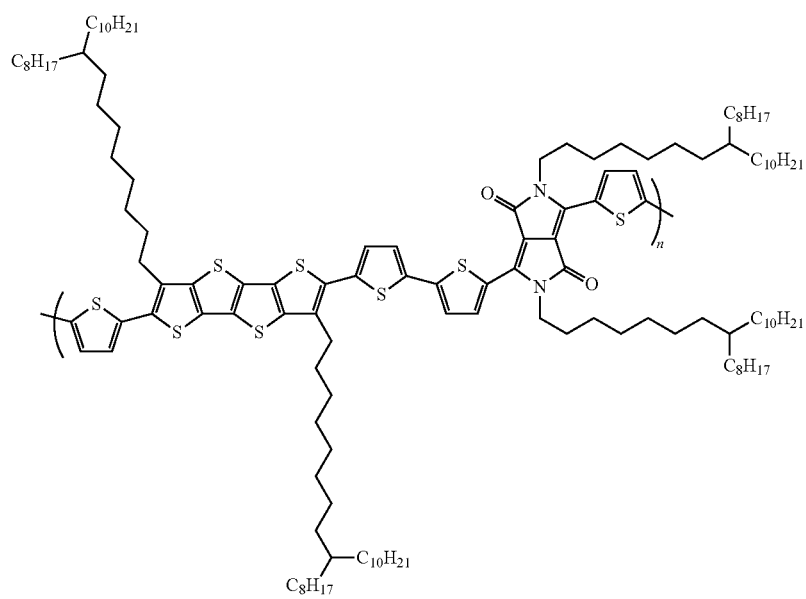

Formula 4

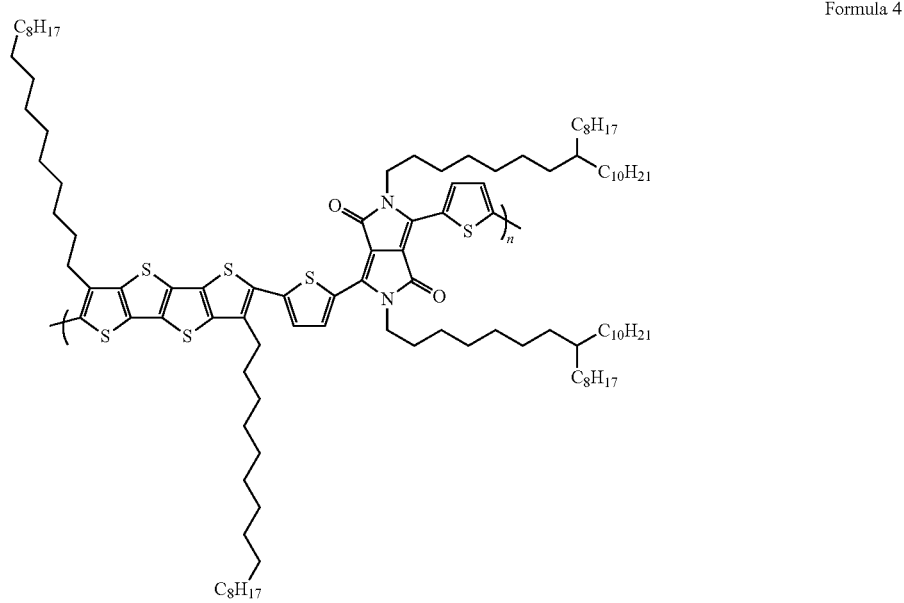

In some examples, the OSC has a solubility of 0.5 mg/mL, 1 mg/mL, 2 mg/mL, 3 mg/mL, 4 mg/mL, 5 mg/mL, or any range defined by any two of those endpoints. In some examples, the OSC has a solubility of 1 mg/mL or more at room temperature.

In some examples, the OSC has hole mobilities of 1 $cm^2V^{-1}$ $s^{-1}$, 2 $cm^2V^{-1}$ $s^{-1}$, 3 $cm^2V^{-1}$ $s^{-1}$, 4 $cm^2V^{-1}$ $s^{-1}$, 5 $cm^2V^{-1}$ $s^{-1}$, 10 $cm^2V^{-1}$ $s^{-1}$, or any range defined by any two In some examples, the OSC polymers have a threshold voltage in thin film transistor devices of 1 V, 2 V, 3V, 4 V, 5 V, 10 V, or any range defined by any two of those endpoints. In some examples, the OSC polymers have a threshold voltage in a range of 1 V to 3 V in thin film transistor devices. In some examples, the OSC polymers have a threshold voltage of 2 V in thin film transistor devices.

Isolating Polymer

In some examples, a polymer blend comprises an OSC polymer blended with an isolating polymer. In some examples, the isolating polymer is a non-conjugated polymer. In some examples, the isolating polymer has a non-conjugated backbone and conjugated side-chains. In some examples, the isolating polymer is not a semi-conducting polymer. In some examples, an isolating polymer is blended with the OSC polymer to prevent oxidation of the OSC.

In some examples, the isolating polymer is at least one of polyacrylonitrile (PAN), alkyl-substituted polyacrylonitrile (R-PAN), polyvinyl chloride (PVC), polyvinylidene fluoride (PVDF), polyethylene (PE) and its copolymer, polystyrene, styrene-butadiene-styrene (SBS), styrene-isoprene-styrene (SIS), styrene-butadiene-styrene rubber (SBR), polystyrene-co-acrylonitrile, acrylonitrile-butadiene-styrene (ABS), styrene-ethylene-butylene-styrene (SEBS), variants of polydimethylsiloxane (PDMS), polysulfonate, polyvinylacetate, polycarbonate, polypropylene, poly(methyl methacrylate), polyamide, polyphenylene sulfide, elastomer block copolymers (e.g., polymethylmethacylate-block-polybutylacrylate (PMMA-b-PBA)), or derivatives, copolymers, and mixtures thereof. In some examples, the isolating polymer is polyacrylonitrile. In some examples, the isolating polymer is polystyrene or derivatives thereof, which may enable large-scale production of OSC devices and pre-aggregation and better alignment of the semiconductor.

In some examples, the isolating polymer has a molecular weight of 1,000, 2,000, 3,000, 4,000, 5,000, 10,000, 15,000, 20,000, 25,000, 35,000, 45,000, 50,000, 75,000, 100,000, 125,000, 150,000, 175,000, 200,000, 225,000, 250,000, or any range defined by any two of those endpoints. In some examples, the molecular weight of the isolating polymer is 5,000 or more. In some examples, the molecular weight of the isolating polymer is 10,000 or more. In some examples, the molecular weight of the isolating polymer is between 50,000 and 200,000.

Photoinitiator

The photoinitiator is a key component of photocuring products. Free-radical based photoinitiators include reactive free radicals that initiate photo-polymerization when exposed to UV light. In one example, the mechanism by which photoinitiator TPO initiates thiol-ene free-radical polymerization is shown below.

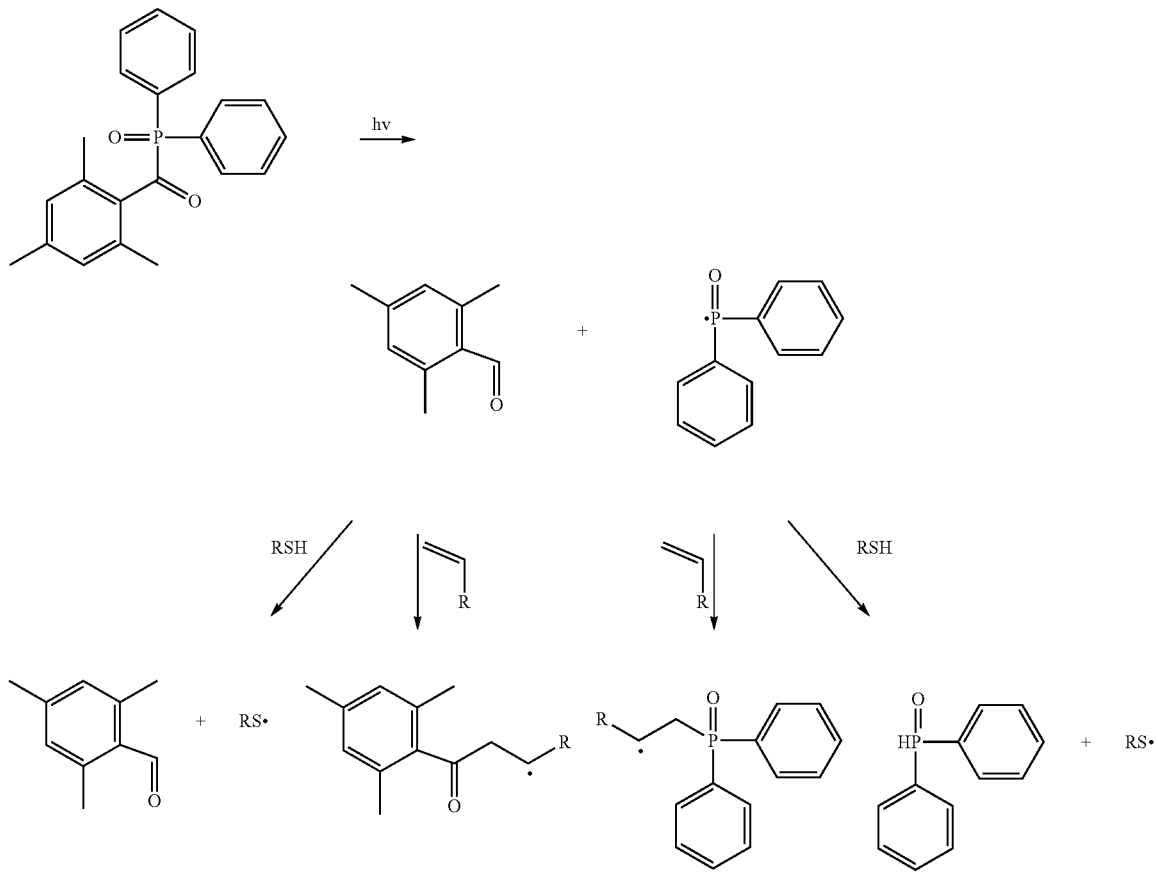

In some examples, a polymer blend comprises an OSC polymer blended with an isolating polymer and at least one photoinitiator configured to generate active radicals.

In some examples, the at least one photoinitiator includes: 1-hydroxy-cyclohexyl-phenyl-ketone (184); 2-benzyl-2-dimethylamino-1-(4-morpholinophenyl)-butanone-1 (369); diphenyl(2,4,6-trimethylbenzoyl)phosphine oxide (TPO); 2-isopropyl thioxanthone (ITX); 1-[4-(phenylthio) phenyl]-1,2-octanedione 2-(O-benzoyloxime) (HRCURE-OXE01); 2,2-dimethoxy-1,2-diphenylethan-1-one (BDK); benzoyl peroxide (BPO); hydroxyacetophenone (HAP); 2-hydroxy-2-methylprophenone (1173); 2-methyl-4'-(methylthio)-2-morpholinopropiophenone (907); 2-Benzyl-2-(dimethylamino)-4'-morpholinobutyrophenone (IHT-PI 910); Ethyl-4-(dimethylamino)benzoate (EDB); Methyl O-Benzoyl Benzoate (OMBB); bis-(2,6 dimethoxy-benzoyl)-phenyl phosphine oxide (BAPO); 4-benzoyl-4' methyldiphenylsulfide (BMS); benzophenone (BP); 1-chloro-4-propoxy thiozanthone (CPTX); chlorothioxanthone (CTX); 2,2-diethoxyacetophenone (DEAP); diethyl thioxanthone (DETX); 2-dimethyl aminoethyl benzonate (DMB); 2,2-dimethoxy-2-phenyl acetophenone (DMPA); 2-ethyl anthraquinone (2-EA); ethyl-para-N,N-dimethyl-dimethylamino lenzoate (EDAB); 2-ethyl hexyl-dimethylaminolenzoate (EHA); 4,4-bis-(diethylamino)-benzophenone (EMK); methyl benzophenone (MBF); 4-methyl benzophenone (MBP); Michler's ketone (MK); 2-methyl-1-[4(methylthiol)phenyl]-2-morpholino propanone (1) (MMMP); 4-phenyl-benzophenone (PBZ); 2,4,6-trimethyl-benzoly-ethoxyl phenyl phosphine oxide (TEPO); or combinations thereof. Structures for representative photoinitiators are shown in Table 1 below.

TABLE 1

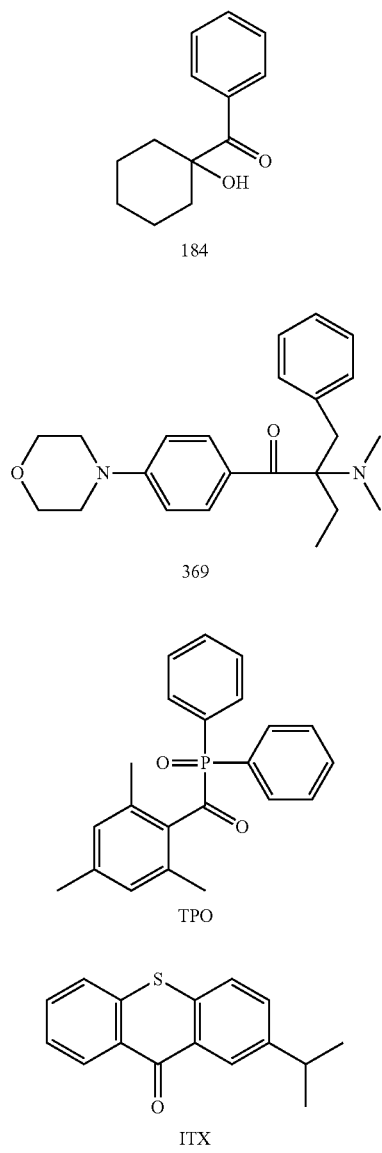

TABLE 1-continued

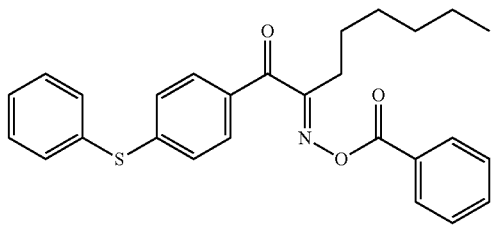

HRCURE-OXE01

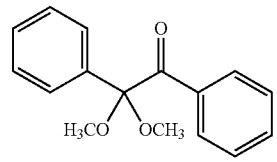

BDK

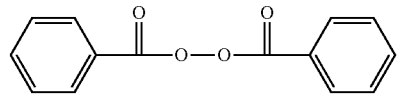

BPO

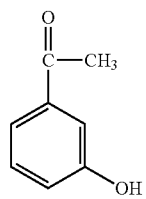

3'-HAP

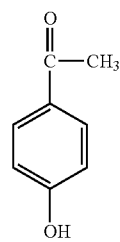

4'-HAP

Crosslinker

In some examples, a polymer blend comprises an OSC polymer blended with an isolating polymer, at least one photoinitiator configured to generate active radicals, and at least one crosslinker comprising C=C bonds, thiols, or combinations thereof.

In some examples, the crosslinker may be a small molecule or a polymer having two or more thiol groups that react with the double bonds in the isolating polymer via thiol-ene click chemistry. In some examples, the crosslinker may be a small molecule or a polymer having two or more acrylate groups that react with the double bonds in the isolating polymer via addition reaction. In some examples, the crosslinker may be a small molecule or a polymer having two or more vinyl groups that react with the double bonds in the isolating polymer via addition reaction.

In some examples, the at least one crosslinker comprises: triallyl isocyanurate (TAIL), trimethylolpropane mercaptopropionate (TRIS),

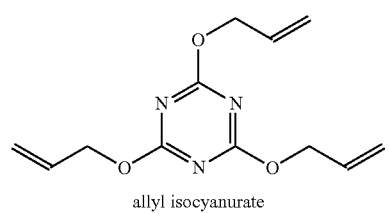
allyl isocyanurate
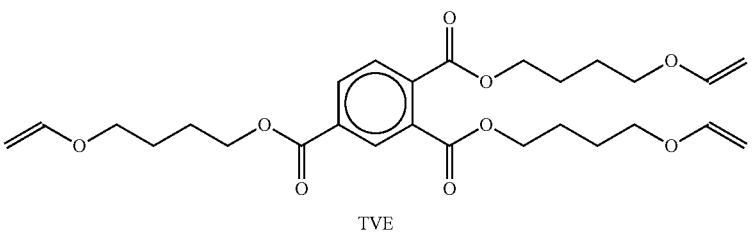
TVE
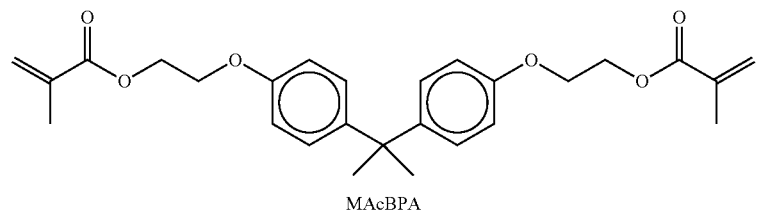
MAcBPA
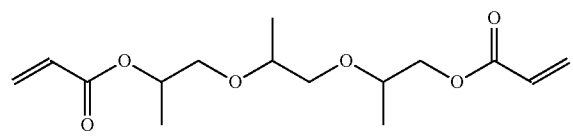
TPGDA
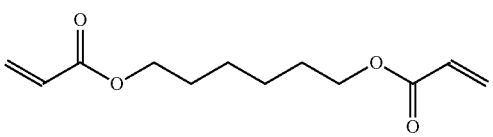
HDDA
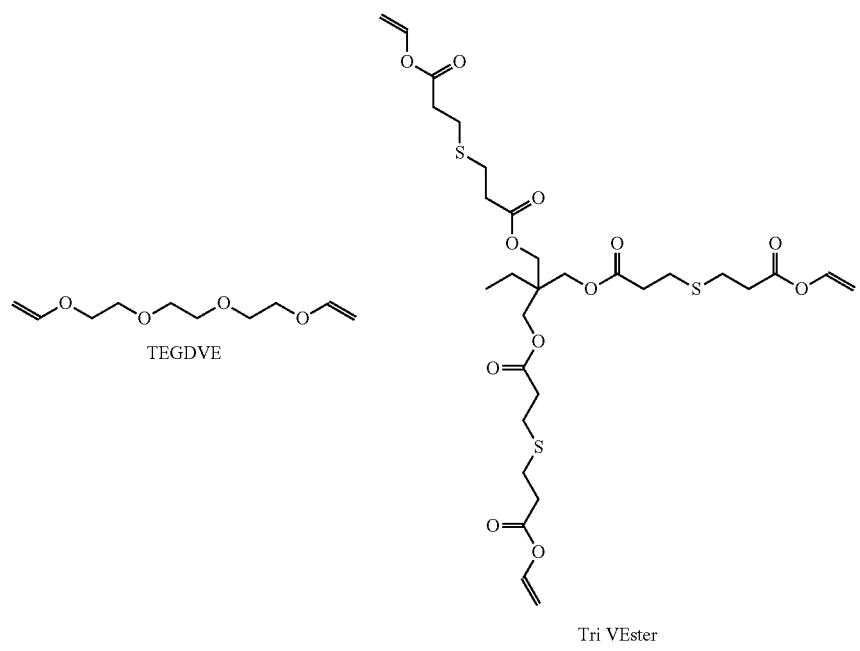
TEGDVE
Tri VEster -continued
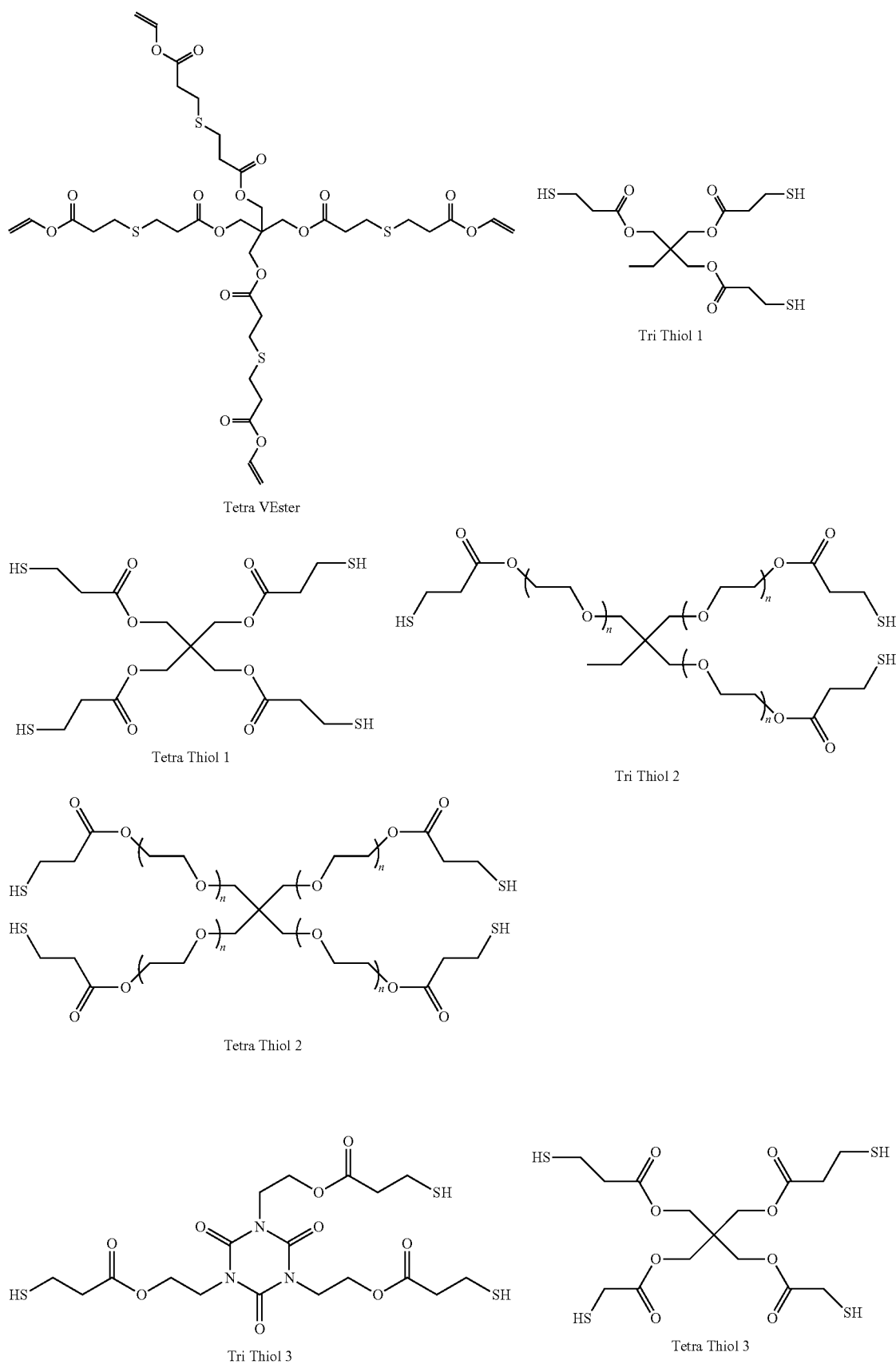

-continued
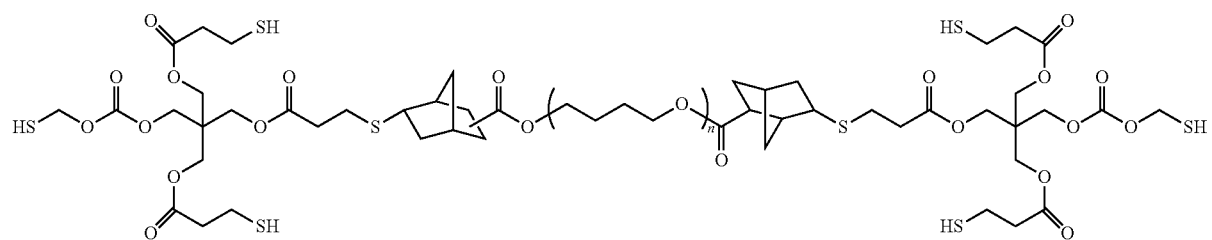
Six Thiol
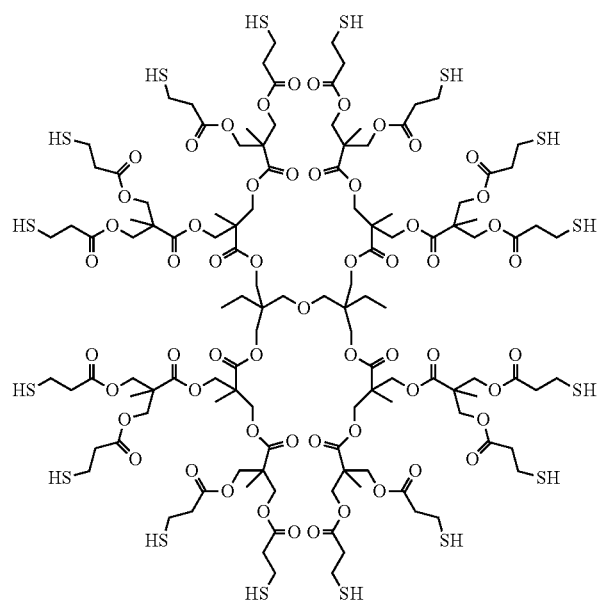
Sixteen Thiol
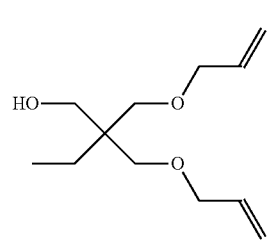
AE1
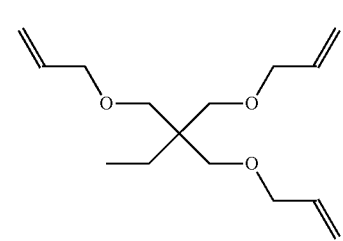
AE2
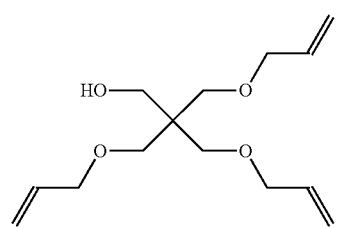
AE3
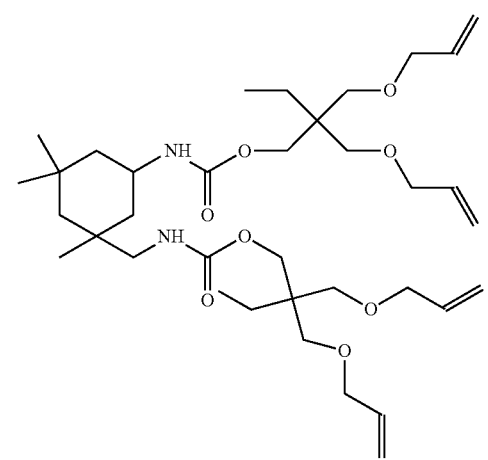
AE4

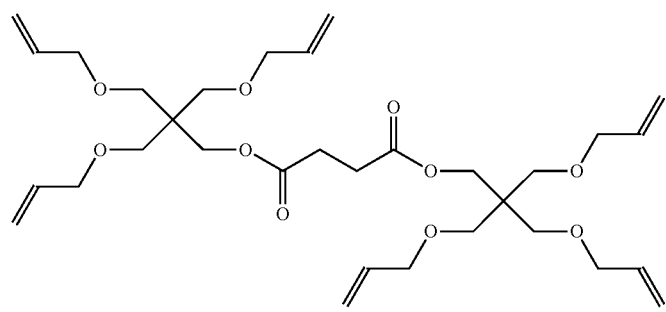
AE5
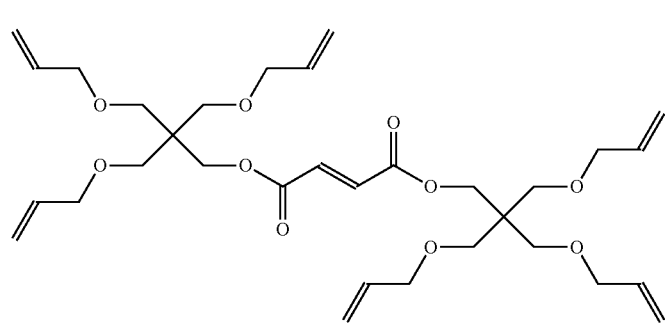
AE6
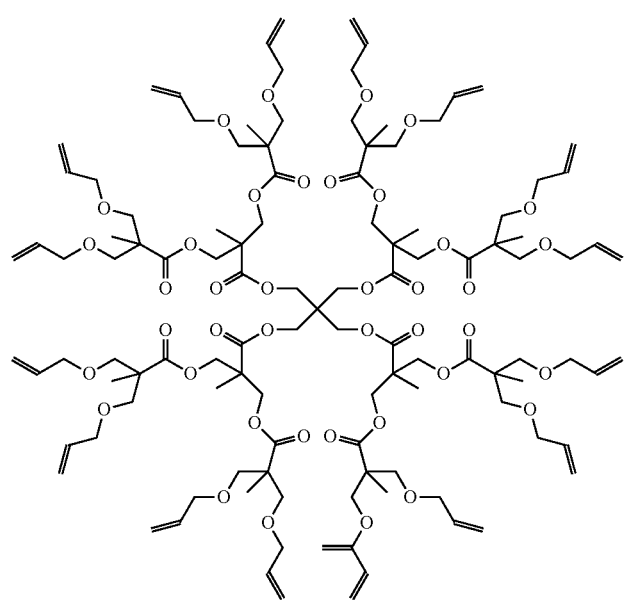
AE7

Structures for representative crosslinkers are shown in Table 2 below.

TABLE 2

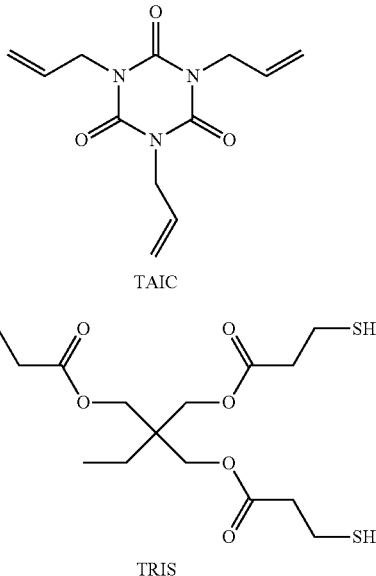

TAIC

TRIS

Polymer Blend

In some examples, the performance of a device comprising the OSC polymer may be improved by blending the OSC polymer with another polymer. In some examples, the OSC polymer is blended with the isolating polymer in a solvent. One advantage of the OSC polymers disclosed herein is that they can be processed easily in non-halogenated solvents. In some examples, the non-halogenated solvent is used to dissolve the mixture of OSC polymers with the isolating polymer. In some examples, the non-halogenated solvent is m-xylene, o-xylene, p-xylene, toluene, tetralin, cis-decalin, trans-decalin, mesitylene, cyclooctane, bicyclohexyl, or combinations thereof. In some examples, a mixture of more than one solvent may be used.

In some examples, the isolating polymer is polystyrene, and the polystyrene plus the non-halogenated solvent enables pre-aggregation and better alignment of the semiconductor. In some examples, the isolating polymer may be copolymers of styrene and other monomers (e.g., styrene-butadiene-styrene (SBS), acrylonitrile-butadiene-styrene (ABS), styrene-ethylene-butylene-styrene (SEBS), styrene-butadiene rubber (SBR), styrene-acrylates, etc.).

In some examples, the weight ratio of the OSC polymer to the isolating polymer is 95:5, 90:10, 85:15, 80:20, 75:25, 70:30, 65:35, 60:40, 55:45, 50:50, 45:55, 60:40, 65:35, 70:30, 75:25, 80:20, 85:15, 90:10, 95:5, or any range defined by any two of those endpoints.

In some examples, the blend comprises at least one of: OSC polymers in a range of 1 wt. % to 99 wt. %, or 5 wt. % to 95 wt. %, or 10 wt. % to 90 wt. %, such as donor-acceptor-type OSC polymers with DPP as the acceptor and fused thiophene as the donor; isolating polymers in a range of 1 wt. % to 99 wt. %, or 5 wt. % to 95 wt. %, or 10 wt. % to 90 wt. %, such as with radical-curable sites from main chain or side chain, or that could readily generate curing sites before or in-situ the UV patterning process (e.g., C=C containing polymers, such as SBS, SIS, SBR, certain acrylic polymers, etc.); photoinitiators in a range of 0.1 wt. % to 5 wt. %, such as those which generate active radicals under UV exposure (e.g., 184, 369, TPO, BPO, BDK, etc.); crosslinkers in a range of 0.05 wt. % to 5 wt. %, such as those having C=C bonds or thiols as curing sites; and additives in a range of 0.05 wt. % to 5 wt. %, such as antioxidants, lubricants, compatibilizer, leveling agents, etc.

In some examples, the blend comprises at least two of: OSC polymers, isolating polymers, photoinitiators, crosslinkers, and additives as described above. In some examples, the blend comprises at least three of: OSC polymers, isolating polymers, photoinitiators, crosslinkers, and additives as described above. In some examples, the blend comprises at least four of: OSC polymers, isolating polymers, photoinitiators, crosslinkers, and additives as described above.

OTFT Device Fabrication

Applications using OTFT devices require patterning of organic semiconducting materials to prevent undesired high off-currents and crosstalk between adjacent devices. As explained above, photolithography is a common patterning technique in semiconductor device fabrication. However, photolithography usually involves harsh $O_2$ plasma during pattern transfer or photoresist removal and aggressive developing solvents which may severely damage the OSC layer and lead to significant deterioration of OTFT device performance. In other words, conjugated organic materials tend to degrade when exposed to light and the chemicals used in photolithography may have an adverse effect on organic thin film transistors. Therefore, patterning of organic semiconducting materials using photolithography is not practical. Moreover, currently available patternable semiconducting polymers with photosensitive side groups require time-consuming molecule design and synthesis. These cross-linked polymers may also have adverse effect on OTFT devices, due to reduction of the effective conjugation of the polymer's crosslinked backbone.

The present application discloses photo-patternable isolating polymers comprising C=C double bonds blended with OSC polymers to enable UV patterning of OSC/isolating polymer blends for OTFT manufacturing.

Thiol-ene polymerizations are organic reactions between a thiol (e.g., OSC polymer) and an alkene (e.g., isolating polymer) to form alkyl sulfides. The free radical-based photoinitiator creates reactive free radicals which initiate photo-polymerization when exposed to UV light. This type of reaction typically proceeds via a free-radical step-growth mechanism involving two steps after the initiation where an intermediate (e.g., carbon-centered radical) is formed (Reaction 1):

Reaction 1: Carbon-centered radical intermediate formation

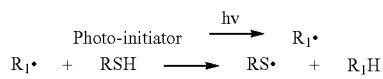

Thereafter, in a first propagation step, a thiol radical is added to the carbon of the ene-functional group (Reaction 2):

Reaction 2: Thiol radical reaction with C=C double bond

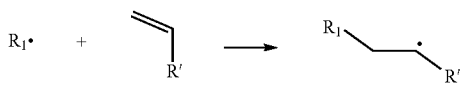

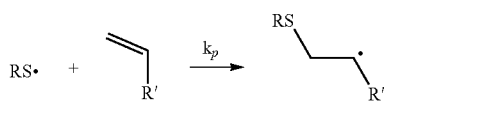

and in a second propagation step, a hydrogen abstraction of a thiol group by a carbon-centered radical forms a thiyl radical (Reaction 3):

Reaction 3: Hydrogen abstraction

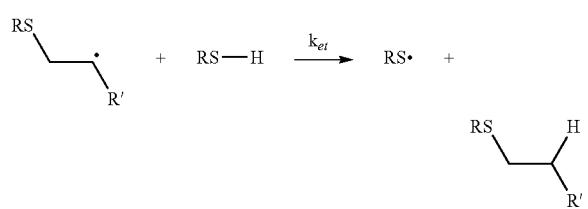

Termination occurs by radical-radical coupling (Reactions 4A to 4C):

Reaction 4A

Reaction 4B

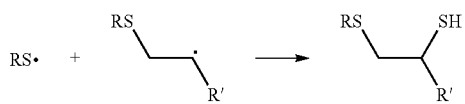

Reaction 4C

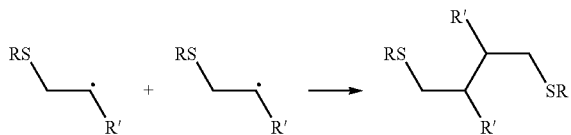

UV crosslinking by thiol-ene reactions may be effectively conducted in air because peroxy radicals formed by $O_2$ scavenging of alkyl groups extract hydrogen atoms from thiol. Thus, after the initiation step of Reaction 1 and the first propagation step of Reaction 2, $O_2$ scavenging of alkyl groups enables formation of peroxy radicals (Reaction 5):

Reactiom 5: $O_2$ scavenging of alkyl groups

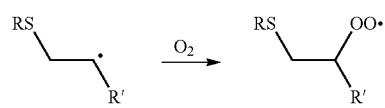

with the peroxy radicals then extracting hydrogen atoms from thiol (Reaction 6):

Reaction 6: Hydrogen extraction

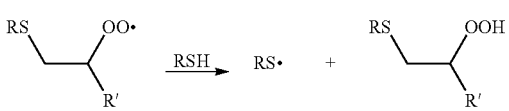

Particularly, photo-induced thiol-ene reactions promote uniform network structures, which ensure high resolution of inscribed patterns and allow nanostructured polymer network formation, which are promising candidates for electronic components including resistors or wires.

FIGS. 1A to 1E illustrate traditional patterning techniques 100 of organic semiconductor blends utilizing photoresists. In a first step (FIG. 1A), a thin film 104 of the blended OSC polymer is deposited over a substrate 102 followed by deposition of a photoresist layer 106 thereon in FIG. 1B. Optionally, the thin film 104 may be thermally annealed. The photoresist deposition may be conducted using processes known in the art such as spin coating. For example, the photoresist, rendered into a liquid form by dissolving the solid components in a solvent, is poured onto the substrate, which is then spun on a turntable at a high speed producing the desired film. Thereafter, the resulting resist film may experience a post-apply bake process (i.e., soft-bake or prebake) to dry the photoresist in removing excess solvent.

Figure 1C:
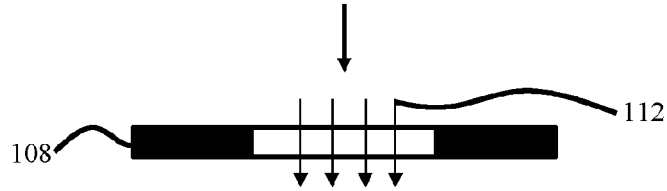
Figure 1D:
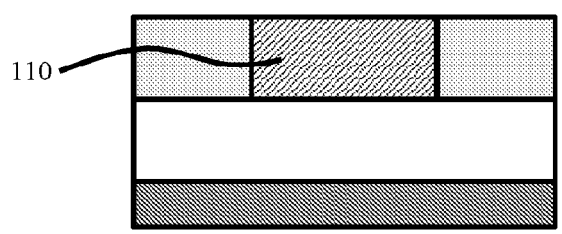
Figure 1E:
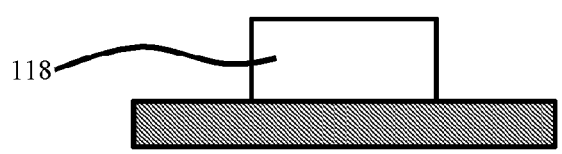

In the step of FIG. 1C, the photoresist layer 106 is exposed to UV light 112 through a master pattern called a photomask 108 positioned some distance away from the photoresist layer 106 to form a higher crosslinked portion 110 of the photoresist layer 106. The exposure to UV light operates to change the solubility of the photoresist in a subsequent developer solvent solution for pattern formation atop the substrate. Prior to the developer, the resist layer may experience a post exposure bake. In the step of FIG. 1D, the pattern 116 of the photoresist layer is transferred into the thin film 104 via subtractive etching 114 (i.e., $O_2$ plasma dry etching). The patterned photoresist layer 116 "resists" the etching and protects the material covered by the photoresist. When the etching is complete, the photoresist is stripped (e.g., using organic or inorganic solutions, and dry (plasma) stripping) leaving the desired pattern 118 etched into the thin film layer.

However, as explained above, aspects of traditional photolithography processes such as harsh $O_2$ plasma during pattern transfer and aggressive photoresist developer solvents and/or stripping solvents may severely damage the OSC layer and lead to significant deterioration of device performance.

FIGS. 2A to 2C illustrate patterning techniques 200 of organic semiconductor blends, according to some embodiments. In a first step (FIG. 2A), a thin film 204 of the blended OSC polymer is deposited over a substrate 202. Optionally, the thin film 204 may be thermally annealed. In some examples, depositing comprises at least one of spin coating; dip coating; spray coating; electrodeposition; meniscus coating; plasma deposition; and roller, curtain and extrusion coating.

The thin film 204 was prepared as a polymer blend described above comprising an organic semiconductor (OSC) polymer blended with an isolating polymer; at least one photoinitiator configured to generate active radicals; and at least one crosslinker comprising C═C bonds, thiols, or combinations thereof, wherein the organic semiconductor polymer is a diketopyrrolopyrrole-fused thiophene polymeric material, wherein the fused thiophene is beta-substituted, and wherein the isolating polymer has a non-conjugated backbone. In some examples, the blending includes dissolving the organic semiconductor polymer in a first organic solvent to form a first solution; dissolving the isolating polymer in a second organic solvent to form a second solution; combining the first solution and the second solution to create the polymer blend. The organic semiconductor polymer may be dissolved overnight at high temperature (e.g., 120° C.) in the first solution; however, isolating polymers may decompose at such high temperature during long time stirring. Thus, the first solution and second solution are prepared separately and then combined. After the combination, the crosslinker and photoinitiator are added into the combined solution as solid or as a third solution containing these two components.

In some examples, the OSC polymer is present in a range of 1 wt. % to 99 wt. %, or 5 wt. % to 95 wt. %, or 10 wt. % to 90 wt. %; the isolating polymer is present in a range of 1 wt. % to 99 wt. %, or 5 wt. % to 95 wt. %, or 10 wt. % to 90 wt. %; the at least one photoinitiator is present in a range of 0.1 wt. % to 5 wt. %; and the at least one crosslinker is present in a range of 0.05 wt. % to 10 wt. %. In some examples, the OSC polymer is present in a range of 10 wt. % to 50 wt. % or 10 wt. % to 30 wt. %. In some examples, the at least one photoinitiator is present in a range of 0.1 wt. % to 2.0 wt. % or 0.1 wt. % to 1.0 wt. %; and the at least one crosslinker is present in a range of 0.3 wt. % to 5.0 wt. %. In some examples, at least one of antioxidants, lubricants, compatibilizers, or leveling agents present in a range of 0.05 wt. % to 5 wt. %.

In some examples, after the thin film of the blended OSC polymer is deposited over the substrate and before exposing the thin film to UV light, the thin film may be heated at a temperature in a range of 50° C. to 200° C. for a time in a range of 10 sec to 10 min to remove excess solvent.

In a second step (FIG. 2B), the thin film 204 was exposed to UV light 208 through a photomask 206 to form a higher crosslinked portion 210 of the thin film 204. In some examples, the exposing comprises exposing the thin film to UV light having an energy in a range of 10 mJ/cm$^2$ to 600 mJ/cm$^2$ (e.g., 400 mJ/cm$^2$) for a time in a range of 1 sec to 60 sec (e.g., 10 sec). In some examples, the UV light may have an energy in a range of 300 mJ/cm$^2$ to 500 mJ/cm$^2$ and be operable for a time in a range of 5 sec to 20 sec.

Similar to photoresist functionality described in FIGS. 1A to 1E, the exposure to UV light operates to change the solubility of the thin film in a subsequent developer solvent solution for pattern formation atop the substrate. The internal photo curing mechanism of the thin film proceeds based on radical initiators and C=C double bonds/thiols as curing sites as described in Reactions 1 to 6. Unlike cationic crosslinking initiated by photoacid generators (PAGs), radical initiators are compatible with small amounts of moisture and water from surrounding environments.

In the step of FIG. 2C, when light exposure is complete, the portion of the thin film 204 not exposed to UV light 208 was stripped using a predetermined solvent 212, thereby leaving the desired pattern 214 into the thin film layer. In other words, the higher crosslinked portion 210 was developed in a solvent to remove an un-patterned region of the thin film 204. In some examples, the developing comprises exposing the un-patterned region of the thin film to a solvent comprising chlorobenzene, 1,2-dichlorobenzene, 1,3-dichlorobenzene, 1,2,4-trichlorobenzene, dioxane, p-xylene, m-xylene, toluene, cyclopentanone, cyclohexanone, methyl lactate, 2-butanone, 2-pentanone, 3-pentanone, 2-heptanone, 3-heptanone, anisole, mesitylene, decalin, butylbenzene, cyclooctane, tetralin, chloroform, or combinations thereof, for a time in a range of 10 sec to 10 min. In some examples, the developer solution comprises chlorobenzene, p-xylene, dioxane, or combinations thereof.

In some examples, after developing the patterned thin film in a solvent to remove the un-patterned region of the thin film, the thin film may be heated at a temperature in a range of 50° C. to 200° C. for a time in a range of 10 sec to 30 min.

Figure 3:
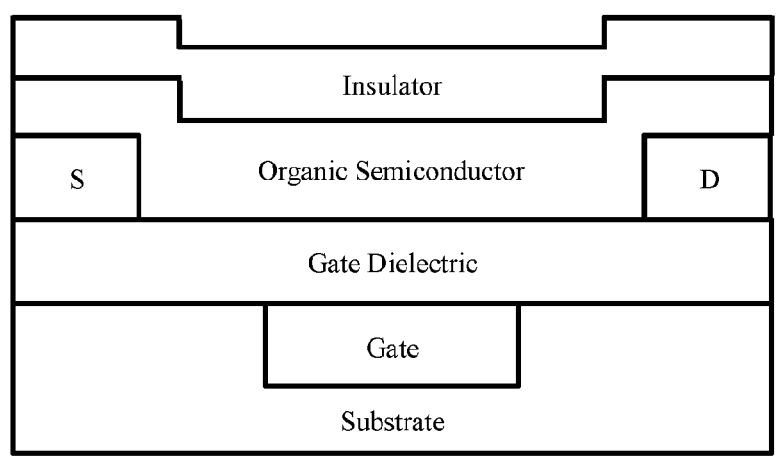
FIG. 3 illustrates an exemplary OTFT device, according to some embodiments.

Thereafter, the OTFT devices may be completed by forming a patterned gate electrode over the substrate; forming a patterned gate dielectric layer over the substrate; forming a patterned source and drain electrodes over the gate dielectric layer; forming a patterned organic semiconductor active layer over the source and drain electrodes and gate dielectric layer, and forming an insulator layer over the patterned organic semiconductor active layer. (FIG. 3).

EXAMPLES

The embodiments described herein will be further clarified by the following examples.

Example 1: Photo-Patterning of OSC/SBS Blends with 369 and/or ITX as Photoinitiators and TRIS as Crosslinker OSC/SBS blends thin films were photo-patterned directly without using a photoresist. The patterned thin film was formed by first spin-coating onto a substrate and then exposing to UV light via a photomask. The exposed areas of the film were crosslinked while the unexposed areas (which remain uncrosslinked and soluble) were removed by a developing solvent, to thereby transfer the pattern of the photomask in a negative-tone manner to the film.

In one example, 0.03 gram of OSC polymer having a structure of Formula 4 and 0.07 gram of styrene-butadiene-styrene (SBS) isolating polymer were separately dissolved in 10 mL p-xylene, stirred at room temperature for 2 hrs, and then mixed to prepare 10 mg/mL solution. Then, a 1 wt. % (0.001 gram) trimethylolpropane mercaptopropionate (TRIS) (CAS No. 33007-83-9) crosslinker, a 1 wt. % (0.001 gram) 2-benzyl-2-dimethylamino-1-(4-morpholinphenyl) butanone (369) (CAS No. 119313-12-1) photoinitiator, and optionally, a 1 wt. % (0.001 gram) 2-isopropyl thioxanthone (ITX) (CAS No. 5495-84-1) photoinitiator were added into the OSC polymer/SBS isolating polymer solution and stirred for 2 min.

The solution was spin-coated on a substrate and pre-baked in air, and then exposed at 365 nm UV light in air through a photomask. Thereafter, the film was soaked in p-xylene developer solution and post-baked in air. As a result of the above process, a patterned organic semiconductor/isolating polymer blend was prepared as a semiconducting layer for OTFTs without the use of photoresists. Preparation conditions are summarized in Table 1, with sample 1 including both 369 and ITX photoinitiator and sample 2 including only 369 photoinitiator.

TABLE 1

| Sample | 1 | 2 |
| --- | --- | --- |
| Formula 4 OSC polymer (g) | 0.03 | |
| SBS (g) | 0.07 | |
| p-xylene (mL) | 10 | |
| Stirring for 2 hrs | RT | |
| TRIS (g) (wt. %) | 0.001 (1%) | |
| 369 (g) (wt. %) | 0.001 (1%) | |
| ITX (g) (wt. %) | 0.001 (1%) | — |
| Pattern? | YES | |

Example 2: Photo-Patterning of OSC/SBS Blends with Varying Photoinitiators and TRIS as Crosslinker OSC/SBS blends thin films were prepared and photo-patterned similarly to the process described in Example 1, with varying photo initiators and concentrations thereof. Preparation conditions are summarized in Table 2. Sample 3 includes TPO photoinitiator, samples 4a and 4b include 0.5 wt. % and 0.8 wt. % 369 photoinitiator, respectively, and samples 5a-5d include 0.3 wt. %, 0.5 wt. %, 0.8 wt. %, and 1 wt. % HRCURE-OXE01 photoinitiator, respectively.

TABLE 2

| Sample | 3 | 4a | 4b | 5a | 5b | 5c | 5d |
|---|---|---|---|---|---|---|---|
| Formula 4 OSC polymer (g) | | | | 0.03 | | | |
| SBS (g) | | | | 0.07 | | | |
| p-xylene (mL) | | | | 10 | | | |
| Stirring overnight | | | | RT | | | |
| TRIS (wt. %) | | | | 1% | | | |
| TPO (wt. %) | 1% | — | | | — | | |
| 369 (wt. %) | — | 0.5% | 0.8% | | — | | |
| HRCURE-OXE01 (wt. %) | — | | — | 0.3% | 0.5% | 0.8% | 1% |
| Pattern? | FIG. 4A | FIG. 4B | FIG. 4C | FIG. 4D | FIG. 4E | FIG. 4F | FIG. 4G |

In the photo-patterning conditions of Table 2, UV exposure energy was decreased due to increased photoinitiator efficiency, such as HRCURE-OXE01 and TPO. It was observed that uncrosslinked SBS in the unexposed regions were selectively dissolved and that high ratios of crosslinker may induce higher degree of photocrosslinking in the exposed portion of the blended polymer film. Moreover, the color contrast of the photo-patterned film was greater with increasing ratios of HRCURE-OXE01 and 369 (see FIGS. 4B to 4G). Thus, patterned organic semiconductor/isolating polymer blends were prepared as semiconducting layers for OTFTs without the use of photoresists.

Example 3: Photo-Patterning of OSC/SBS Blends with Varying Developers

OSC/SBS blends thin films were prepared and photo-patterned similarly to the process described in Example 1, with varying OSC polymers and developer solutions. Preparation conditions are summarized in Table 3. Samples 6a and 6b both include a mixture of Formula 3 and Formula 4 OSC polymers with chlorobenzene/1,4-dioxane and p-xylene/1,4-dioxane, respectively, developer solution. Samples 7a and 7b both include Formula 4 OSC polymer with chlorobenzene/1,4-dioxane and p-xylene/1,4-dioxane, respectively, developer solution.

Figure 5A:
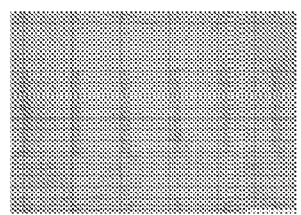
FIGS. 5A to 5G illustrate patterning of organic semiconductor blends with varying ratios of organic solvent mixtures, according to some embodiments.
Figure 5B:
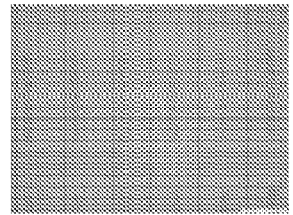
Figure 5C:
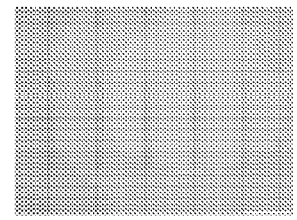
Figure 5D:
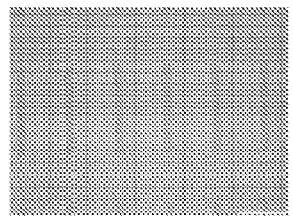
Figure 5E:
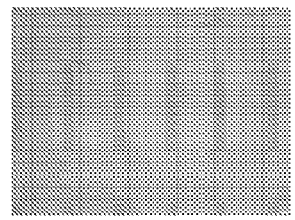
Figure 5F:
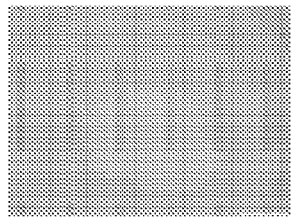
Figure 5G:
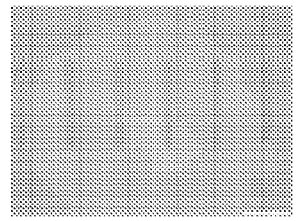

In the photo-patterning conditions of Table 3, chlorobenzene/1,4-dioxane and p-xylene/1,4-dioxane solvent mixtures were investigated as developing agents. FIGS. 5A to 5C illustrate the color contrast of samples 6a and 6b with chlorobenzene/1,4-dioxane developer (having ratios of 7/3 (FIG. 5A), 8/2 (FIG. 5B), and 9/1 (FIG. 5C)) and FIGS. 5D and 5E illustrate the color contrast of samples 6a and 6b with p-xylene/1,4-dioxane developer (having ratios of 7/3 (FIG. 5D) and 8/2 (FIG. 5E)). FIG. 5F illustrates the color contrast of samples 7a and 7b with chlorobenzene/1,4-dioxane developer (having a ratio of 7/3) and FIG. 5G illustrates the color contrast of samples 7a and 7b with p-xylene/1,4-dioxane developer (having a ratio of 7/3).

It was observed that the color contrast of the photo-patterned film was greater with decreasing ratio (i.e., less) of chlorobenzene (compare, for example, FIGS. 5A to 5C). It was also observed that the color contrast of the photo-patterned film was greater with decreasing ratio (i.e., less) of p-xylene (compare, for example, FIGS. 5D and 5E). The addition of 1,4-dioxane decreased the solubility of OSC in solvent mixtures and resulted in more OSC remaining on the substrate.

Example 4: Device Performance of OSC/SBS Blend Systems

FIG. 3 illustrates the structure of a typical bottom-gate bottom-contact OTFT. Photo-crosslinked OSC/SBS blend films as described herein were incorporated into bottom-gate bottom-contact OTFTs as the organic semiconductor layer. A gate electrode (e.g., gold, Au) was patterned. In some examples, an epoxide gate insulator layer was spin-coated and photopatterned through a photomask. A source/drain (e.g., Au) was patterned. The OSC/SBS blends solution was spin-coated on a substrate, pre-baked in air, and then exposed at 365 nm UV light in air through a photomask. Thereafter, the film was soaked in p-xylene developer solution and post-baked in air.

TABLE 3

| Sample | 6a | 6b | 7a | 7b |
|---|---|---|---|---|
| OSC (g) | Formula 3/Formula 4 OSC polymers (0.009/0.021) | | Formula 4 OSC polymer (0.03) | |
| SBS (g) | 0.07 | | | |
| Chlorobenzene (mL) | 10 | | | |
| Stirring overnight | RT | | | |
| TRIS (wt. %) | 1% | | | |
| HRCURE-OXE01 (wt. %) | 0.8% | | | |
| Soaking | chlorobenzene/dioxane | p-xylene/dioxane | chlorobenzene/dioxane | p-xylene/dioxane |
| Pattern? | FIG. 5A   FIG. 5B   FIG. 5C (7/3)   (8/2)   (9/1) | FIG. 5D   FIG. 5E (7/3)   (8/2) | FIG. 5F (7/3) | FIG. 5G (7/3) |

Figure 6:
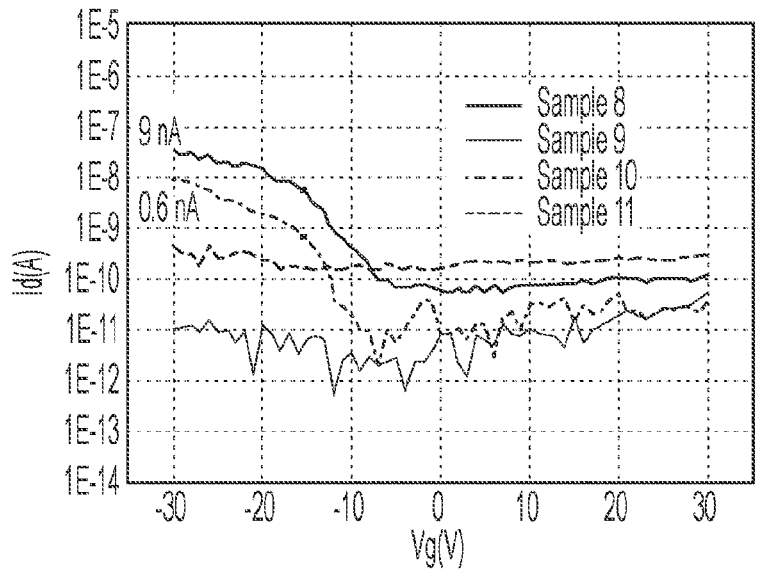
FIG. 6 illustrates OTFT device performance with varying ratios of additives and solution concentrations, according to some embodiments.

FIG. 6 compares electrical properties of various OTFT devices as prepared above and summarized in Table 4.

TABLE 4

| Sample | 8 | 9 | 10 | 11 |
|---|---|---|---|---|
| Formula 4 OSC polymer:SBS | | 3:7 | | |
| TRIS (wt. %) | 1% | 1% | 2% | 1% |
| 369 (wt. %) | | | 1% | |
| ITX (wt. %) | 1% | — | — | 1% |
| Concentration (mg/mL) | 10 | 20 | 20 | 20 |
| Device performance | Weak | None | Weak | None |

The 'On' current was 0.6 nA ($V_g$=−15V) with 2 wt. % TRIS and 1 wt. % 369 when solution concentration was 20 mg/mL (Sample 10). The 'On' current was 9 nA ($V_g$=−15V) with 1 wt. % TRIS, 1 wt. % 369, and 1 wt. % ITX when solution concentration was 10 mg/mL (Sample 8). On-off current ratios are $10^{-2}$-$10^{-3}$ with turn-on voltages ranging from −5V to 5V.

Figure 7:
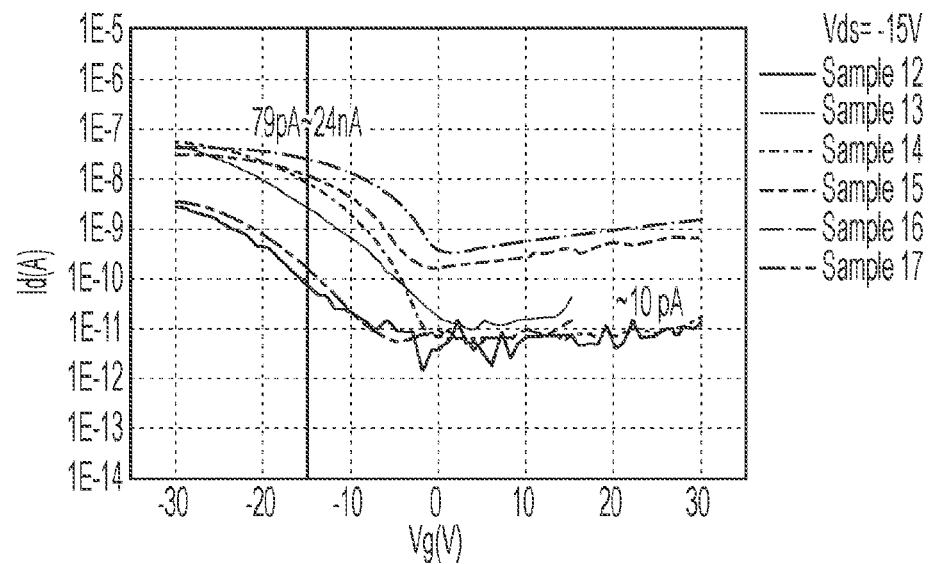
FIG. 7 illustrates OTFT device performance with varying initiators and treatments, according to some embodiments.

FIG. 7 compares electrical properties of various OTFT devices as prepared above and summarized in Table 5. The fabrication processes of bottom-gate, bottom-contact OTFT are as provided herein. Photoinitiators decompose into active radicals under UV light exposure, which may induce photo-polymerization/crosslinking. The effects of various photoinitiators were investigated on device performance. Samples 12-14 were exposed at 365 nm UV light in air through a photomask (with varying photoinitiators). Samples 16 and 17 were exposed under 365 nm UV light in air without a photomask (sample 16 was also not soaked with developing solvents). Sample 15 was not exposed under UV light nor soaked with developing solvents.

TABLE 5

| Sample | 12 | 13 | 14 | 15 | 16 | 17 |
|---|---|---|---|---|---|---|
| Formula 4 OSC polymer:SBS | | | | 3:7 | | |
| TRIS (wt. %) | | | | 1% | | |
| TPO (wt. %) | 0.8% | — | — | — | — | — |
| HRCURE-OXE01 (wt. %) | — | 0.5% | — | 0.8% | 0.8% | 0.8% |
| 369 (wt. %) | — | — | 0.8% | — | — | — |
| UV (365 nm, air)? | photomask | | | No | no photomask | |
| Soaking in p-xylene? | Yes | | | No | No | Yes |

The 'On' current was 0.079 nA to 24 nA ($V_g$=−15V) with the same crosslinker (TRIS) and different photo-initiators (TPO for Sample 12; HRCURE-OXE01 for Samples 13 and 15-17; and 369 for Sample 14). On-off current ratios are $10^{-2}$-$10^{-3}$ with turn-on voltages ranging from −5V to 5V.

Figure 8:
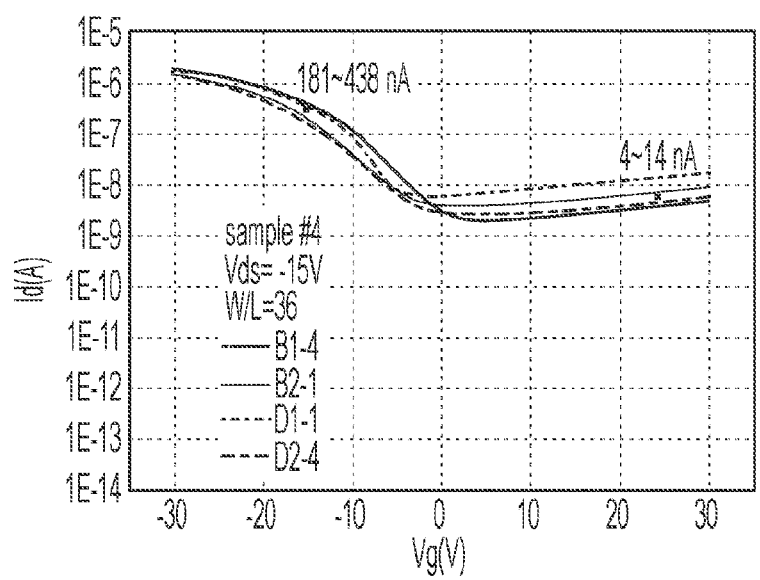
FIG. 8 illustrates OTFT device performance with varying mixed development solvent, according to some embodiments.

FIG. 8 compares electrical properties of a bottom-gate bottom-contact OTFT device prepared with a OSC polymer layer stripped with a developer mixture. The OSC polymer film was exposed at 365 nm UV light in air through a photomask and then soaked in a solvent mixture comprising chlorobenzene and 1,4-dioxane to develop. Table 6 summarizes preparation procedures.

TABLE 6

| Sample | 18 |
|---|---|
| Formula 4 OSC polymer:SBS (g) | 0.03:0.07 |
| Chlorobenzene (mL) | 10 |
| TRIS (wt. %) | 1% |
| HRCURE-OXE01 (wt. %) | 0.8% |
| Soaking | chlorobenzene/dioxane (7:3) |

The device performance improved significantly when developed in mixed solvents, especially when 'On' current increased to 181-438 nA ($V_g$=−15V) (as shown in FIG. 8). In order to increase 'On' current ($V_g$=−15V), solvent mixtures were investigated as developing agents. Chlorobenzene is a good solvent for OSC and SBS, while 1,4-dioxane is a good solvent for SBS, but poor solvent for OSC. Thus, more OSC would remain in the blending film as compared with using only p-xylene as developing agent. For at least this reason, device performance improved significantly when developed in mixed solvents (versus in a single solvent (e.g., chlorobenzene) good for both OSC and SBS). Compared with previous examples (e.g., samples 12-14), sample 18 displays improved device performance, especially for 'On' current. Multiple devices were tested (B1-4, B2-1, D1-1, and D2-4) and confirm reproducibility.

Example 5: UV-Patterning Process and OTFT Manufacturing Procedure

General UV-Patterning Process for OSC/Isolating Polymer Blends

In some examples, the process comprises the following steps: In solution 1, an OSC polymer was dissolved in a suitable organic solvent. To ensure complete dissolving, the mixture may be heated at elevated temperature. For example, Formula 4 OSC polymer may be dissolved in p-xylene at 120° C. for 16 hrs. In solution 2, an isolating polymer was dissolved with the same solvent as the OSC polymer and stirred for several hours at 20-25° C. to ensure complete dissolving. Solution 1 and solution 2 are then combined and then at least one photo initiator, crosslinker and other additives are added, with further stirring to the combination for several minutes to ensure complete dissolving. The combination may then be deposited on the substrate and then spin-coated to obtain polymer films with thickness 10 nm to 200 nm (Schwan Technology® Easy Coater 6). A confocal layer scanning microscope (CLSM) (Keyence Corporation® VK-X260K) may be utilized to characterize the morphology of spin-coated thin-films.

The film may be baked at elevated temperature for several minutes in air at, for example, 100° C. for 4 min, and then exposed to parallel UV light using a photo-mask to pattern the film. After exposure, the film is soaked in a suitable developer solvent or solvent mixtures to rinse off the unpatterned region. After blow drying the patterned film with air, the patterned film is again baked at elevated temperature for several minutes in air at, for example, 100° C. for 10 min.

General Manufacturing Procedure for OTFT Device

In some examples, a bottom gate, bottom contact OTFT device can be formed as following: patterning a gold (Au) or silver (Ag) gate electrode onto a substrate, followed by spin-coating a dielectric onto the substrate and treating to obtain a gate dielectric layer. After patterning Au or Ag source and drain electrodes, an OSC layer may be formed by the materials and methods of patterning as described herein to a thickness in a range of 10 nm to 200 nm. Finally, an insulator layer was positioned. One example of the formed OTFT device is shown in FIG. 3.

Thus, as presented herein, improved UV patternable organic semiconductor/isolating polymer blends and uses thereof for OSC layers of organic thin-film transistors are disclosed as well as methods of fabricating OTFT devices comprising the UV patternable blends.

Advantages of the UV patternable organic semiconductor/isolating polymer blends and methods of fabrication thereof include: (1) patterning conducted directly in air, which is highly desired by industrial applications for low cost manufacturing of OTFT devices based on patterned polymer films; (2) highly efficient patterning under conditions (e.g., power, time, etc.) which lead to micro-patterned films with high resolution (e.g., 10 μm×10 μm); and (3) direct patterning of UV-curable OSC blends to avoid using photoresist, leading to a more efficient and environmental benign process. Additional advantages of the UV patterning include: (1) the use of reduced quantities of OSC polymers (e.g., to a range of 10 wt. % to 50 wt. %, or even 10 wt. % to 30 wt. %) as compared to traditional methods using upwards of 80 wt. %, to thereby reduce material costs of OTFT manufacturing; and (2) the use of reduced quantities of crosslinkers and photo initiators (e.g., to a range of 1 wt. % and 0.8 wt. %, respectively) to minimize negative side effects on OTFT device performance.

Moreover, the UV patterning of the OSC polymer/isolating polymer blends may be tailored. For example, the UV patterning formulations may be modified having (1) different types of OSC based on donor-acceptor structures; and (2) varying types and loading amounts of isolating polymer, photoinitiator, and crosslinker. The UV patterning process may also be tailored. For example, the process may be modified having (1) varied UV exposing time, wavelength, and power of the UV lamp; (2) varied choices for solvents used in spin-coating and soaking to achieve desired UV patterning (e.g., single solvent or solvent mixtures); and (3) varied times and temperatures for pre-bake and post-bake steps to help obtain optimized OTFT performance.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

As utilized herein, "optional," "optionally," or the like are intended to mean that the subsequently described event or circumstance can or cannot occur, and that the description includes instances where the event or circumstance occurs and instances where it does not occur. The indefinite article "a" or "an" and its corresponding definite article "the" as used herein means at least one, or one or more, unless specified otherwise.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

It will be apparent to those skilled in the art that various modifications and variations can be made without departing from the spirit or scope of the claimed subject matter.

Accordingly, the claimed subject matter is not to be restricted except in light of the attached claims and their equivalents.

What is claimed is:

1. A polymer blend, comprising:
   an organic semiconductor polymer blended with an isolating polymer;
   at least one photoinitiator configured to generate active radicals; and
   at least one crosslinker comprising two or more vinyl groups, two or more thiols, or combinations thereof,
   wherein the organic semiconductor polymer is a diketopyrrolopyrrole-fused thiophene polymeric material, wherein the fused thiophene is beta-substituted,
   wherein the isolating polymer has a non-conjugated backbone, and
   wherein the organic semiconductor polymer comprises a repeat unit of Formula 1 or Formula 2, or a salt or isomer thereof:

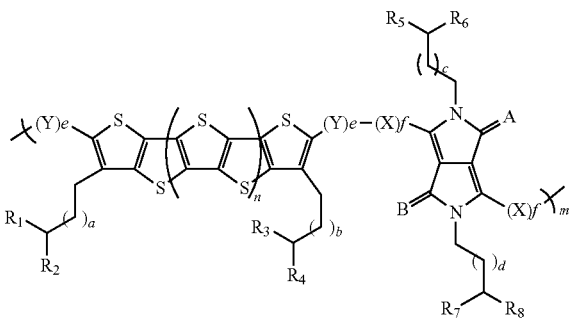

Formula 1

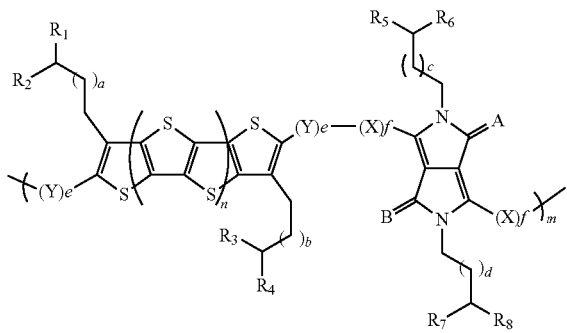

Formula 2 wherein in Formula 1 and Formula 2:
m is an integer greater than or equal to one;
n is 0, 1, or 2;
$R_1$, $R_2$, $R_3$, $R_4$, $R_5$, $R_6$, $R_7$, and $R_8$, are, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl;
a, b, c, and d are independently, integers greater than or equal to 3;
e and f are integers greater than or equal to zero;
X and Y are, independently a covalent bond, an optionally substituted aryl group, an optionally substituted heteroaryl, an optionally substituted fused aryl or fused heteroaryl group, an alkyne or an alkene; and
A and B are, independently, either S or O, with the provisos that:

i. At least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;
ii. if any of $R_1$, $R_2$, $R_3$, or $R_4$ is hydrogen, then none of $R_5$, $R_6$, $R_7$, or $R_8$ are hydrogen;
iii. if any of $R_5$, $R_6$, $R_7$, or $R_8$ is hydrogen, then none of $R_1$, $R_2$, $R_3$, or $R_4$ are hydrogen;
iv. e and f cannot both be 0; and
v. if either e or f is 0, then c and d, independently, are integers greater than or equal to 5.

2. The polymer blend of claim 1, wherein:
the organic semiconductor polymer is present in a range of 5 wt. % to 95 wt. %;
the isolating polymer is present in a range of 5 wt. % to 95 wt. %;
the at least one photoinitiator is present in a range of 0.1 wt. % to 5 wt. %; and
the at least one crosslinker is present in a range of 0.05 wt. % to 10 wt. %;
wherein the organic semiconductor polymer, isolating polymer, at least one photoinitiator, and at least one crosslinker are selected to add to 100 wt. %.

3. The polymer blend of claim 1, wherein:
the organic semiconductor polymer is present in a range of 10 wt. % to 50 wt. %.

4. The polymer blend of claim 1, wherein:
the at least one photoinitiator is present in a range of 0.1 wt. % to 2.0 wt. %; and
the at least one crosslinker is present in a range of 0.3 wt. % to 5.0 wt. %.

5. The polymer blend of claim 1, further comprising:
at least one of antioxidants, lubricants, compatibilizers, or leveling agents present in a range of 0.05 wt. % to 5 wt. %.

6. The polymer blend of claim 1, wherein the isolating polymer is at least one of polyacrylonitrile (PAN), polyvinyl chloride (PVC), polyvinylidene fluoride (PVDF), alkyl-substituted polyacrylonitrile (R-PAN), polyethylene (PE), polystyrene, styrene-butadiene-styrene (SBS), styrene-isoprene-styrene (SIS), styrene-butadiene-styrene rubber (SBR), polystyrene-co-acrylonitrile, acrylonitrile-butadiene-styrene (ABS), styrene-ethylene-butylene-styrene (SEBS), polydimethylsiloxane (PDMS), polysulfonate, polyvinylacetate, polycarbonate, polypropylene, poly (methyl methacrylate) (PMMA), polyamide, polyphenylene sulfide, polymethylmethacylate-block-polybutylacrylate (PMMA-b-PBA), or derivatives thereof, copolymers thereof and mixtures thereof.

7. The polymer blend of claim 1, wherein the isolating polymer comprises an unsaturated C=C backbone.

8. The polymer blend of claim 1, wherein the at least one photoinitiator comprises: 1-hydroxy-cyclohexyl-phenyl-ketone (184); 2-benzyl-2-dimethylamino-1-(4-morpholinophenyl)-butanone-1 (369); diphenyl(2,4,6-trimethylbenzoyl)phosphine oxide (TPO); 2-isopropyl thioxanthone (ITX); 1-[4-(phenylthio) phenyl]-1,2-octanedione 2-(O-benzoyloxime) (HRCURE-OXE01); 2,2-dimethoxy-1,2-diphenylethan-1-one (BDK); benzoyl peroxide (BPO); hydroxyacetophenone (HAP); 2-hydroxy-2-methylprophenone (1173); 2-methyl-4'-(methylthio)-2-morpholinopropiophenone (907); 2-Benzyl-2-(dimethylamino)-4'-morpholinobutyrophenone (IHT-PI 910); Ethyl-4-(dimethylamino)benzoate (EDB); Methyl O-Benzoyl Benzoate (OMBB); bis-(2,6 dimethoxy-benzoyl)-phenyl phosphine oxide (BAPO); 4-benzoyl-4' methyldiphenylsulfide (BMS); benzophenone (BP); 1-chloro-4-propoxy thiozanthone (CPTX); chlorothioxanthone (CTX); 2,2-diethoxyacetophenone (DEAP); diethyl thioxanthone (DETX); 2-dimethyl aminoethyl benzonate (DMB); 2,2-dimethoxy-2-phenyl acetophenone (DMPA); 2-ethyl anthraquinone (2-EA); ethyl-para-N,N-dimethyl-dimethylamino lenzoate (EDAB); 2-ethyl hexyl-dimethylaminolenzoate (EHA); 4,4-bis-(diethylamino)-benzophenone (EMK); methyl benzophenone (MBF); 4-methyl benzophenone (MBP); Michler's ketone (MK); 2-methyl-1-[4(methylthiol)phenyl]-2-morpholino propanone (1) (MMMP); 4-phenylbenzophenone (PBZ); 2,4,6-trimethylbenzoly-ethoxyl phenyl phosphine oxide (TEPO); or combinations thereof.

9. The polymer blend of claim 1, wherein the at least one crosslinker comprises: triallyl isocyanurate (TAIC), trimethylolpropane mercaptopropionate (TRIS),

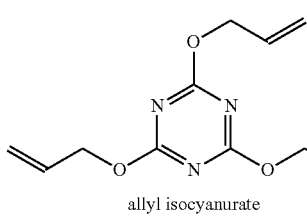

allyl isocyanurate

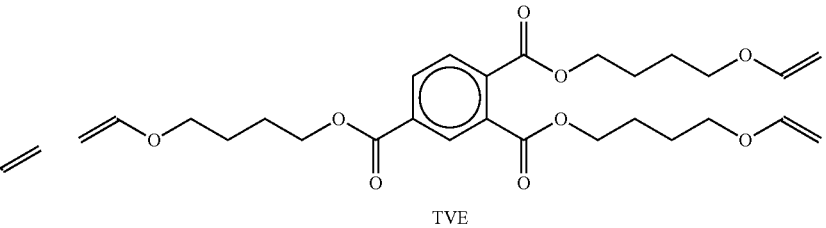

TVE

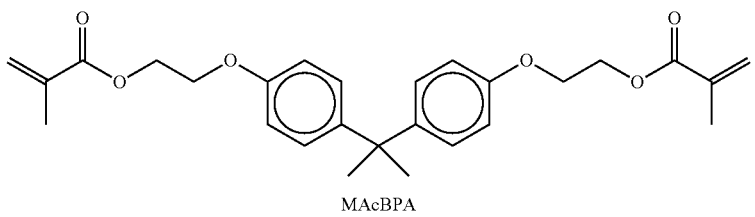

MAcBPA

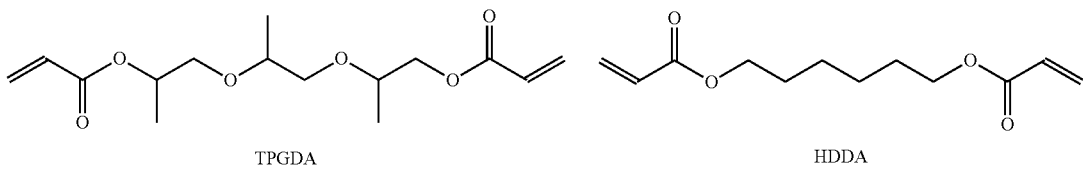

TPGDA                    HDDA

-continued
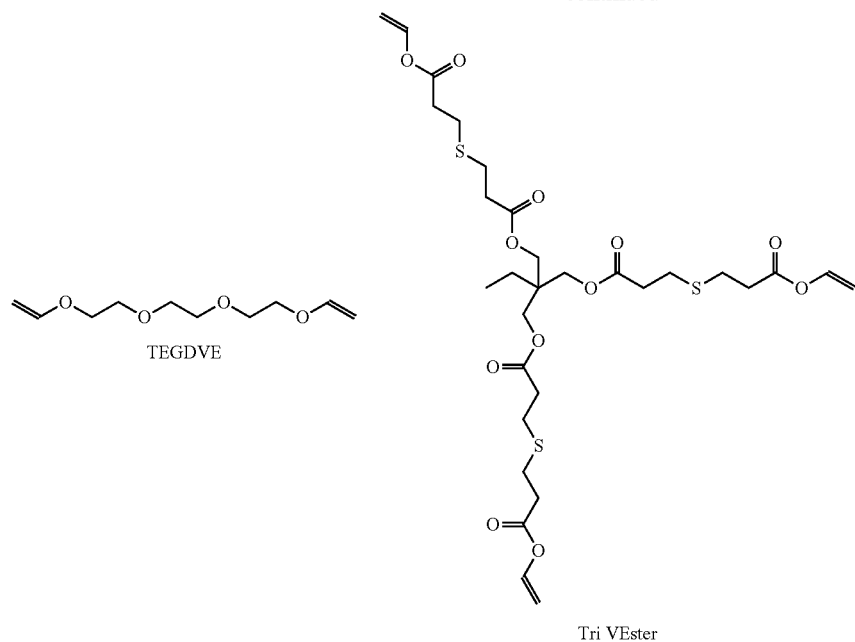
TEGDVE
Tri VEster
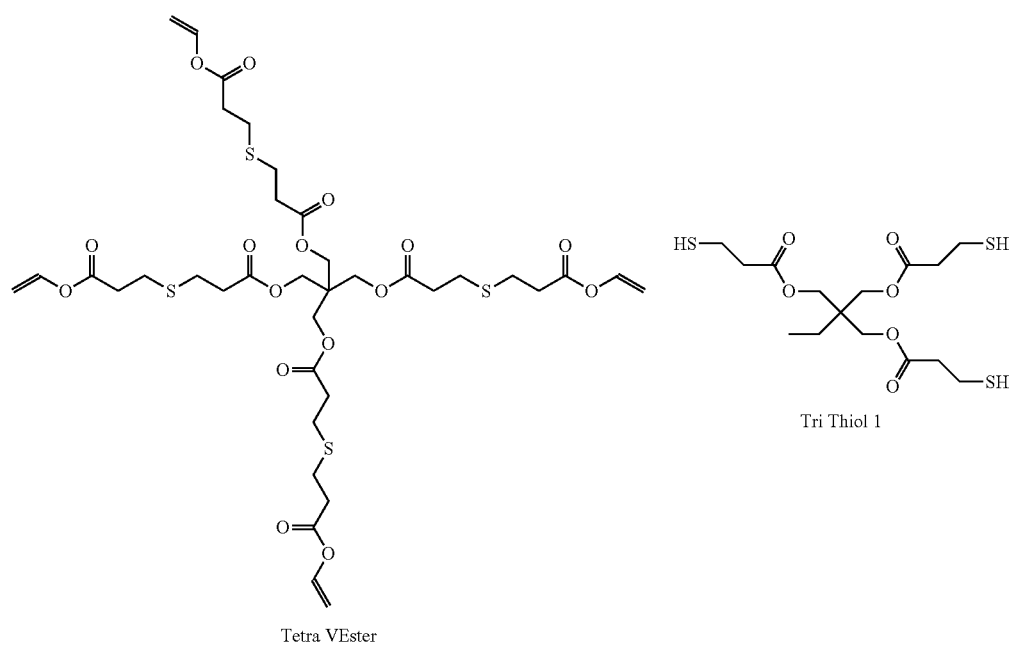
Tetra VEster
Tri Thiol 1
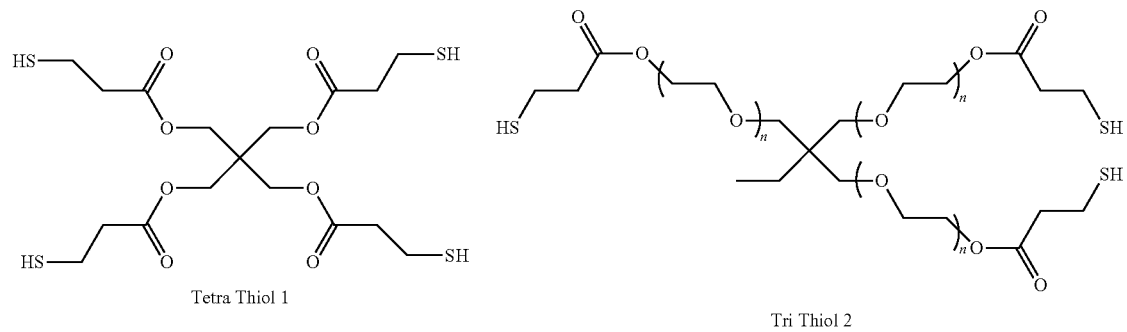
Tetra Thiol 1
Tri Thiol 2

-continued
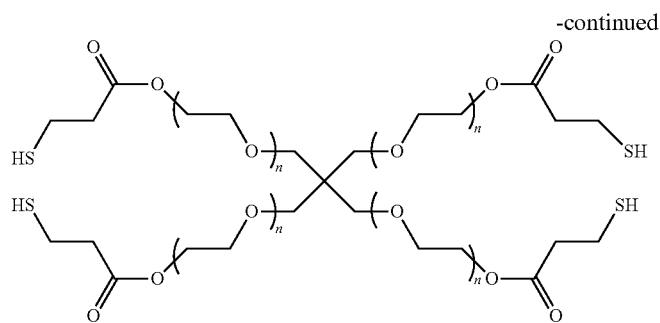
Tetra Thiol 2
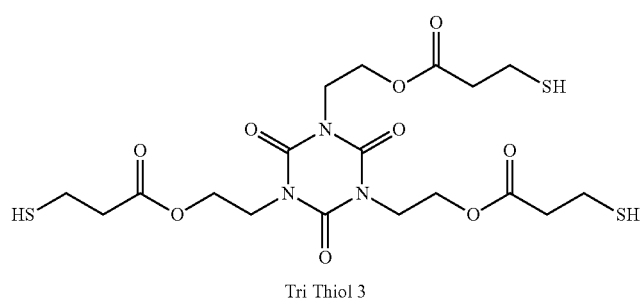
Tri Thiol 3
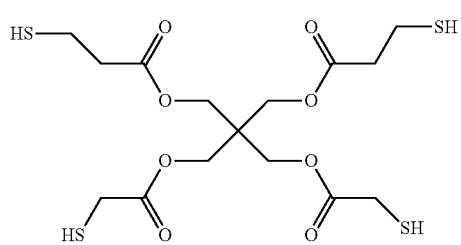
Tetra Thiol 3
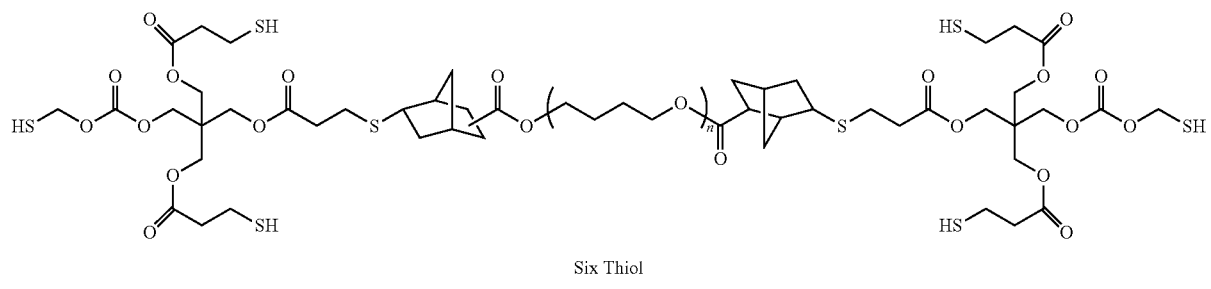
Six Thiol
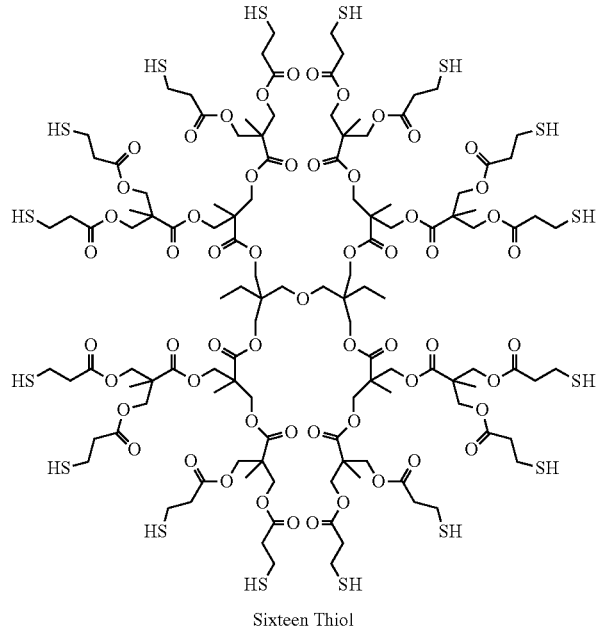
Sixteen Thiol -continued
AE1
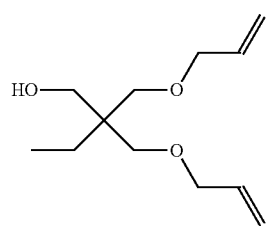
AE2
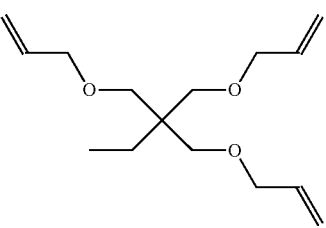
AE3
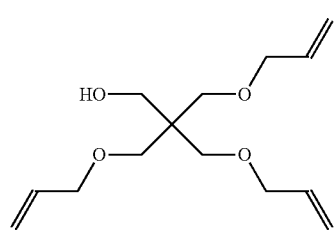
AE4
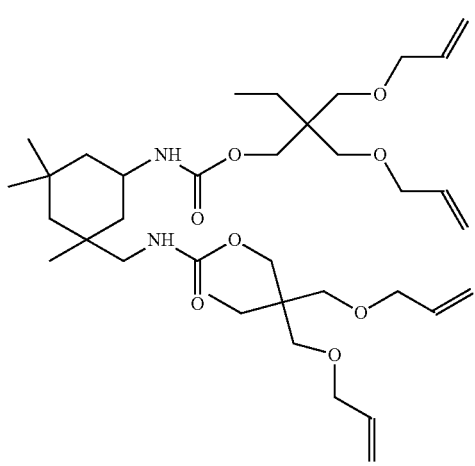
AE5
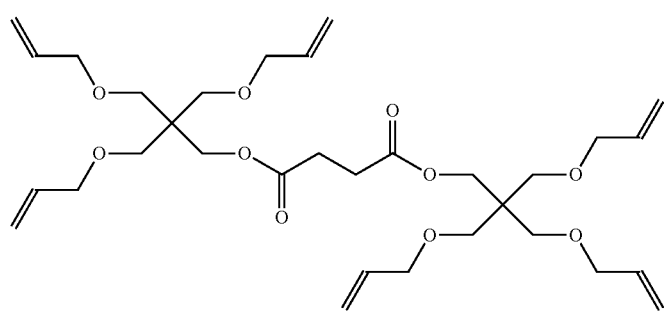
AE6
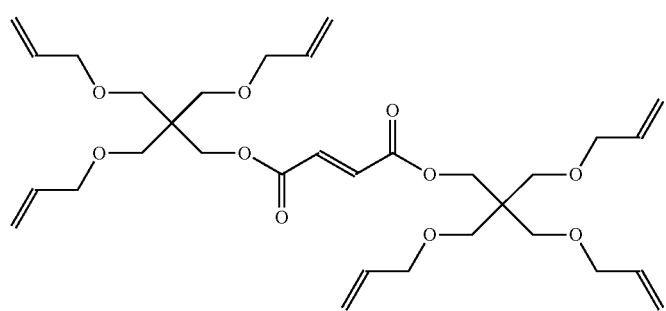

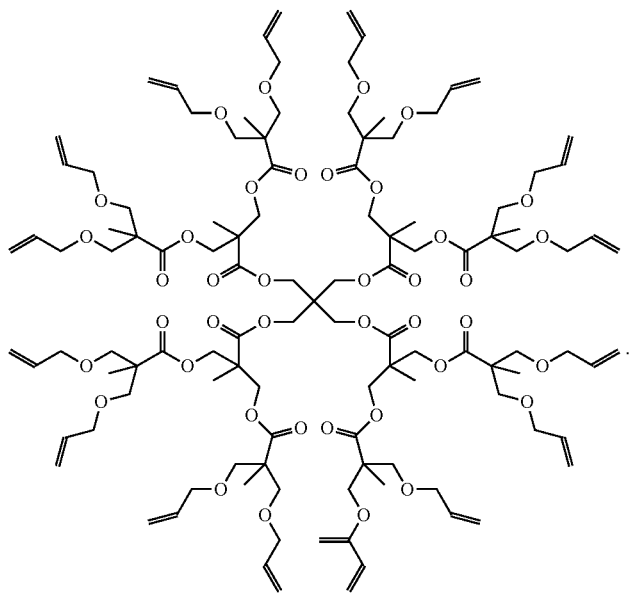

AE7

10. A method of forming an organic semiconductor device, comprising:

blending an organic semiconductor polymer with an isolating polymer in an organic solvent to create a polymer blend;

depositing a thin film of the polymer blend over a substrate;

exposing the thin film to UV light using a photo-mask to form a patterned thin film; and developing the patterned thin film in a solvent to remove an un-patterned region of the thin film, wherein the organic semiconductor polymer comprises a repeat unit of Formula 1 or Formula 2, or a salt or isomer thereof:

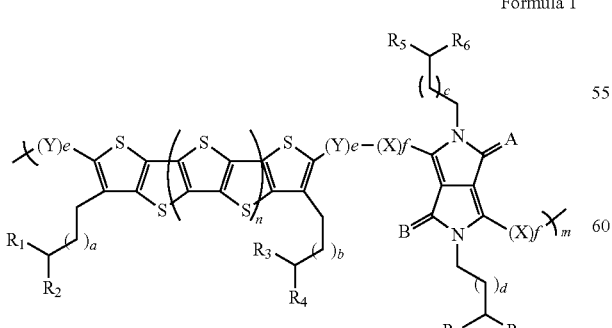

Formula 1

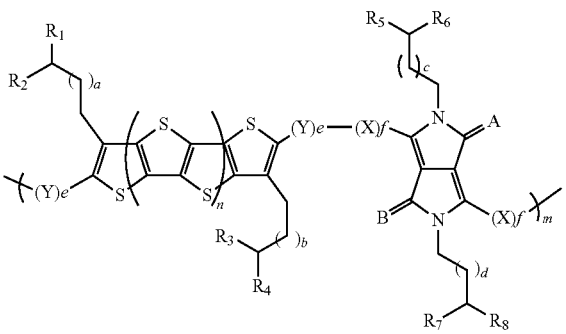

Formula 2 wherein in Formula 1 and Formula 2:

m is an integer greater than or equal to one;

n is 0, 1, or 2;

$R_1$, $R_2$, $R_3$, $R_4$, $R_5$, $R_6$, $R_7$, and $R_8$, are, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl;

a, b, c, and d are independently, integers greater than or equal to 3;

e and f are integers greater than or equal to zero;

X and Y are, independently a covalent bond, an optionally substituted aryl group, an optionally substituted heteroaryl, an optionally substituted fused aryl or fused heteroaryl group, an alkyne or an alkene; and A and B are, independently, either S or O, with the provisos that:

i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;

ii. if any of $R_1$, $R_2$, $R_3$, or $R_4$ is hydrogen, then none of $R_5$, $R_6$, $R_7$, or $R_8$ are hydrogen;

iii. if any of $R_5$, $R_6$, $R_7$, or $R_8$ is hydrogen, then none of $R_1$, $R_2$, $R_3$, or $R_4$ are hydrogen;

iv. e and f cannot both be 0; and
v. if either e or f is 0, then c and d, independently, are integers greater than or equal to 5, and
wherein the isolating polymer has a non-conjugated backbone.

11. The method of claim 10, wherein the blending comprises:
dissolving the organic semiconductor polymer in a first organic solvent to form a first solution;
dissolving the isolating polymer in a second organic solvent to form a second solution;
combining the first solution and the second solution to create the polymer blend.

12. The method of claim 10, wherein the depositing comprises at least one of: spin coating; dip coating; spray coating; electrodeposition; meniscus coating; plasma deposition; and roller, curtain and extrusion coating.

13. The method of claim 10, wherein the exposing comprises:
exposing the thin film to UV light having an energy in a range of 10 mJ/cm$^2$ to 600 mJ/cm$^2$ for a time in a range of 1 sec to 60 sec.

14. The method of claim 10, wherein the developing comprises exposing the un-patterned region of the thin film to a solvent comprising: chlorobenzene, 1,2-dichlorobenzene, 1,3-dichlorobenzene, 1,2,4-trichlorobenzene, dioxane, p-xylene, m-xylene, toluene, cyclopentanone, cyclohexanone, methyl lactate, 2-butanone, 2-pentanone, 3-pentanone, 2-heptanone, 3-heptanone, anisole, mesitylene, decalin, butylbenzene, cyclooctane, tetralin, chloroform, or combinations thereof, for a time in a range of 10 sec to 10 min.

15. The method of claim 10, wherein the isolating polymer comprises an unsaturated C=C backbone or is configured to generate C=C backbone prior to or during the UV light exposure.

16. The method of claim 10, wherein the polymer blend further comprises:
at least one photoinitiator configured to generate active radicals; and
at least one crosslinker comprising two or more vinyl groups, two or more thiols, or combinations thereof.

17. The method of claim 16, wherein:
the organic semiconductor polymer is present in a range of 5 wt. % to 95 wt. %;
the isolating polymer is present in a range of 5 wt. % to 95 wt. %;
the at least one photoinitiator is present in a range of 0.1 wt. % to 5 wt. %; and
the at least one crosslinker is present in a range of 0.05 wt. % to 10 wt. %;
wherein the organic semiconductor polymer, isolating polymer, at least one photoinitiator, and at least one crosslinker are selected to add to 100 wt. %.

18. The method of claim 10, further comprising:
a first heating of the thin film at a temperature in a range of 50° C. to 200° ° C. for a time in a range of 10 sec to 10 min between the depositing and exposing.

19. The method of claim 18, further comprising:
a second heating of the patterned thin film at a temperature in a range of 50° ° C. to 200° C. for a time in a range of 10 sec to 30 min after the developing.

20. The method of claim 13, further comprising:
forming a gate electrode over the substrate;
forming a gate dielectric layer over the substrate and the gate electrode;
forming a patterned source and drain layer over the gate dielectric layer; and
forming an insulator layer over the patterned source and drain layer.

* * * * *

UNITED STATES PATENT AND TRADEMARK OFFICE
CERTIFICATE OF CORRECTION

PATENT NO. : 12,048,236 B2
APPLICATION NO. : 17/283359
DATED : July 23, 2024
INVENTOR(S) : Mingqian He et al.

Page 1 of 1

It is certified that error appears in the above-identified patent and that said Letters Patent is hereby corrected as shown below:

In the Claims

In Claim 18, Column 52, Line 21, delete "200° °" and insert --200°--

In Claim 19, Column 52, Line 25, delete "50° °" and insert --50°--

In Claim 20, Column 52, Line 27, delete "13" and insert --19--

Signed and Sealed this
Thirty-first Day of December, 2024

Derrick Brent
*Acting Director of the United States Patent and Trademark Office*